United States Patent
Goto et al.

[11] Patent Number: 6,042,894
[45] Date of Patent: Mar. 28, 2000

[54] ANISOTROPICALLY ELECTROCONDUCTIVE RESIN FILM

[75] Inventors: Yasushi Goto; Isao Tsukagoshi, both of Shimodate; Tomohisa Ohta, Tochigi-ken, all of Japan

[73] Assignee: Hitachi Chemical Company, Ltd., Tokyo, Japan

[21] Appl. No.: 08/890,342

[22] Filed: Jul. 9, 1997

Related U.S. Application Data

[63] Continuation of application No. 08/434,299, May 3, 1995, abandoned.

[30] Foreign Application Priority Data

| May 10, 1994 | [JP] | Japan | 6-096336 |
| May 10, 1994 | [JP] | Japan | 6-096337 |
| May 10, 1994 | [JP] | Japan | 6-096338 |
| Sep. 2, 1994 | [JP] | Japan | 6-209714 |

[51] Int. Cl.[7] .............. C08J 7/04; B05D 5/00; B05D 1/36
[52] U.S. Cl. .......... 427/504; 427/510; 427/498; 427/512; 427/505; 427/516; 427/197; 427/198; 427/203; 427/204; 427/205
[58] Field of Search ............... 427/498, 504, 427/505, 510, 512, 516, 464, 467, 468, 469, 470, 474, 197, 198, 199, 203, 205, 58; 439/66

[56] References Cited

U.S. PATENT DOCUMENTS

| 3,245,341 | 4/1966 | Childress et al. ............... 427/474 |
| 3,649,354 | 3/1972 | Te Velde ............... 427/203 |
| 3,787,277 | 1/1974 | Oomen et al. ............... 427/203 |
| 4,113,981 | 9/1978 | Fujita et al. ............... 174/88 R |
| 4,219,596 | 8/1980 | Takemoto ............... 427/516 |
| 4,401,686 | 8/1983 | Durand ............... 427/199 |
| 4,425,382 | 1/1984 | Tajima ............... 427/205 |
| 4,490,409 | 12/1984 | Nablo ............... 427/505 |
| 4,560,587 | 12/1985 | Sasaki ............... 427/203 |
| 4,606,962 | 8/1986 | Reylek et al. ............... 428/148 |
| 4,680,226 | 7/1987 | Takeda ............... 428/327 |
| 4,737,112 | 4/1988 | Jin et al. ............... 439/66 |
| 5,001,542 | 3/1991 | Tsukagoshi et al. ............... 357/68 |
| 5,034,245 | 7/1991 | Matsubara ............... 427/205 |
| 5,187,007 | 2/1993 | Ebe et al. ............... 427/516 |
| 5,213,849 | 5/1993 | Maner ............... 427/504 |
| 5,283,101 | 2/1994 | Li ............... 427/203 |
| 5,352,318 | 10/1994 | Takabayashi et al. ............... 427/205 |

FOREIGN PATENT DOCUMENTS

| 0 242 025 | 10/1987 | European Pat. Off. |
| 0 265 212 | 4/1988 | European Pat. Off. |
| 0 330 452 | 8/1989 | European Pat. Off. |
| 0 622 839 | 11/1994 | European Pat. Off. |
| 5-18031 | 3/1993 | Japan . |

*Primary Examiner*—Marianne Padgett
*Attorney, Agent, or Firm*—Antonelli, Terry, Stout & Kraus, LLP

[57] ABSTRACT

An isotropically electroconductive resin film material produced by sticking electroconductive particles to a sticking layer formed on a support and fixing therein, and filling a film-forming resin incompatible with the sticking material among the electroconductive particles, has electroconductivity only in the film thickness direction via the electroconductive particles uniformly dispersed in the plane direction, and is suitable for electrically connecting oppositely placed circuits and fine electrodes of a plurality of electronic parts, and for testing electronic parts.

15 Claims, 8 Drawing Sheets

*FIG. 2H*
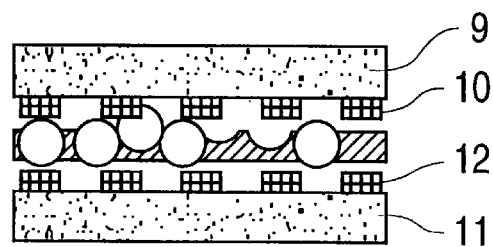
*FIG. 2I*
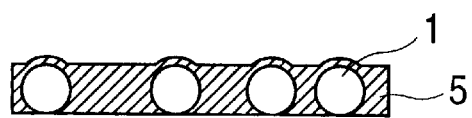
*FIG. 2J*
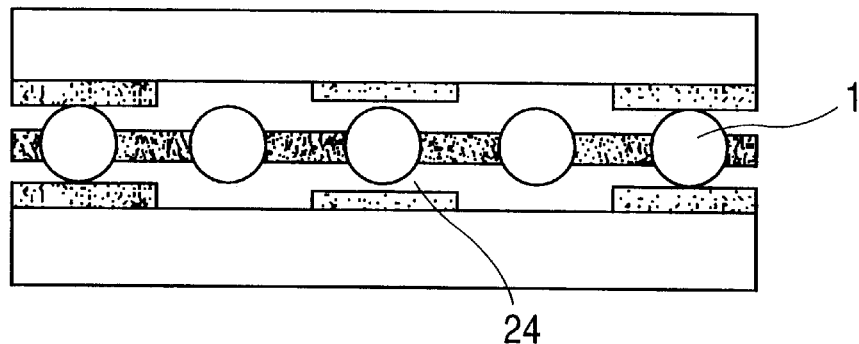
*FIG. 2K*
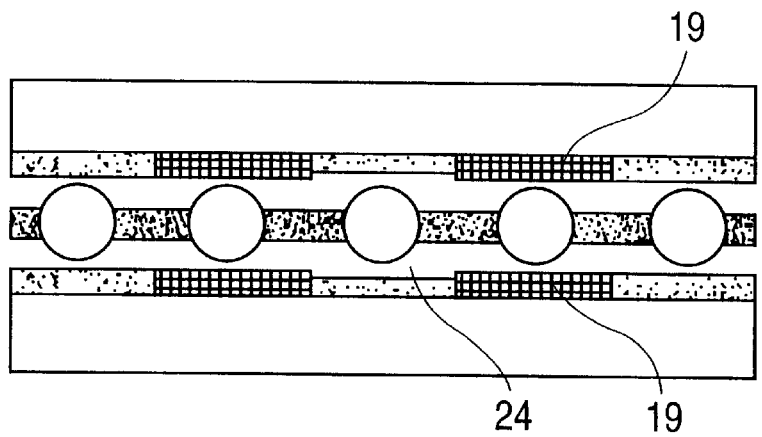
*FIG. 2L*

ANISOTROPICALLY ELECTROCONDUCTIVE RESIN FILM

This application is a continuation of application Ser. No. 08/434,299, filed May 3, 1995 now abandoned.

BACKGROUND OF THE INVENTION

The present invention relates to an anisotropically electroconductive resin film having electroconductivity in the thickness direction alone via the electroconductive particles dispersed in the film, film-like material, a process for electrically connecting circuits and a connected structure using said film, and an electronic part testing process using the connected structure.

Miniaturization of electronic parts has entailed higher density and higher fineness of the circuits used therein. As the conventional solder or rubber connectors can hardly meet the connecting specifications of these fine circuits, anisotropically electroconductive adhesives or connecting means made of a film are popularly used recently. In these methods, a layer of electrical connecting means made of an insulating resin containing a specified amount of an electroconductive material is disposed between the opposing circuits and pressed, with heating if necessary, to set up electrical connection between the upper and lower circuits as well as electrical insulation between the adjoining circuits. It is also common practice to use insulating resin as an adhesive for making electrical connection between the opposing circuits and fixing thereof.

Prior art literature relating to anisotropically electroconductive resin films having electroconductivity in the thickness direction alone includes Japanese Patent Unexamined Publication (JP-A) 51-21192 which discloses a process for producing said type of resin film according to which a mixture of electroconductive particles and a nonconductive base resin which keeps said particles uncontacted with each other is molded into a sheet having a thickness substantially equal to the size of the particles to provide a sheet-like product having electroconductivity in the thickness direction alone, and Japanese Patent Post-Exam Publication (JP-B) 59-31190 which discloses a sheet-like one-piece electrical connector comprising a homogeneous mixture of electroconductive particles (0.05–20 vol %) and a flexible insulating binder. In these prior art disclosures, a molding of a resin film material having a desired thickness is obtained by rolling a mixture of a resin and electroconductive particles homogeneously dispersed therein, or by casting a liquid resin having electroconductive particles homogeneously dispersed therein to a desired thickness by a bar coater or other suitable means and then drying or curing the casting.

For obtaining a film in which the concentration of electroconductive particles differs from one direction to the other, that is, the film thickness direction, there are known a method in which electroconductive particles are contained in a porous film and then said film and electroconductive particles are bonded and fixed (Japanese Utility Model Unexampled Publication (JUM-A) 61-196413), and a method in which electroconductive particles are embedded in an adhesive film (JP-A-2-117980 and JP-A-5-67480).

When obtaining circuit connection by disposing an anisotropically electroconductive film having electroconductivity in the thickness direction alone between the circuits and pressing them into a contacted state, it is effective to have the individual electroconductive particles exposed on both sides of the film for reducing connection resistance. As means for exposing the electroconductive particles on both sides of the film, besides those disclosed in the abovementioned patents, methods are known in which the film is rolled (JP-A-61-23507 and JP-A-61-188818), or rolling and sputter etching are used in combination (JP-A-61-200616). Methods are also usable in which electroconductive particles are contained in a porous film and said film and electroconductive particles are bonded and fixed (JP-A-5-74512), or electroconductive particles are held between a pair of flat plates and then a liquid resin is filled between said plates and molded into a film (JP-A-2-239578). In other known methods, the surface layers of film-forming resin on both sides of the film are removed by dissolution or decomposition with a solvent, or by physical means such as sputter etching, plasma etching or excimer laser irradiation.

In these anisotropic conductive resin films having electroconductivity in the thickness direction alone, in order to obtain higher resolution by increasing the electroconductive points per unit area, it is necessary to increase the content of electroconductive particles in the film. In the functional test before mounting the electronic parts such as liquid crystal displays (LCD), tape automated bonding (TAB) integrated circuits, bare chip integrated circuits and the like, connection of fine electrodes has been made by use of a pin probe, a device by which a needle-like electrode is pressed into contact with the corresponding electrode of the electronic part to be tested.

Connection mechanisms such as shown in the following prior art literature have also been proposed. In the connection mechanism disclosed in JUM-A-53-156569, JP-A-54-67672, etc., an anisotropically electroconductive rubber sheet is sandwiched between the electrode section of an electronic part to be tested and an testing substrate for making electrical connection. Said anisotropically electroconductive rubber sheet comprises laminations of electroconductive rubber and insulating rubber, in which electroconductive particles are uniformly dispersed or electroconductive short fibers are contained with orientation in the thickness direction of the insulating rubber sheet. In the connection system disclosed in JP-A-3-183974, electroconductive particles are localized at the positions corresponding to the electrodes for the purpose of improving fineness of said anisotropically electroconductive rubber sheet. According to the electrical connecting method proposed in JP-A-59-155769 and JUM-A-59-163967, the conductive pattern formed on a flexible film is directly contacted with the electrode section of the electronic part to be tested. In the connection system disclosed in JP-A-61-2338, JP-A-1-128381, JP-B-2-44747, JP-B-3-22367, etc., an electroconductive protuberance is provided on the conductive pattern and this protuberance is directly contacted with the electrode section of the electronic part. Further, JUM-A-5-18031 proposes a connection mechanism in which an anisotropically electroconductive film having a protuberant electrode extending through an insulating polymer film is disposed between the part to be tested and a testing printed substrate. The prior art devices such as mentioned above, however, have their own problems. For instance, according to the film molding method comprising casting a homogeneous mixture of a liquid resin and electroconductive particles, when it is tried to increase the mixing ratio of the electroconductive particles in correspondence to high fineness of electrode, the viscosity of the liquid resin having the electroconductive particles dispersed therein elevates to impair fluidity of the liquid resin, making it difficult to perform constant-thickness casting by a bar coater or such means. This necessitates a decrease of the mixing ratio of electroconductive particles. Further, in the case of the film having electroconductive particles uniformly dispersed therein, when the mixing ratio of electroconductive particles is increased in conformity to high-fineness circuits, there is also inevitably increased the amount of those electroconductive particles which are not held between the connected circuits and make no contribution to electrical conduction, giving rise to the problem of elevated production cost. Also, in the method in which electroconductive particles are contained in a porous film and then said film and electroconductive particles are bonded and fixed, it is impractical in terms of productivity and cost to form a large number of minute holes in the film. In the method in which the electroconductive particles are embedded in an adhesive film, the adhesive won't be wetted sufficiently on the electroconductive particle surfaces unless the viscosity of the adhesive is sufficiently low to preserve the desired liquid state, and consequently adhesiveness of the filmy adhesive to the electroconductive particles is lowered, making the electroconductive particles liable to fall off the film. In case of using a liquid filmy resin, it is unavoidable that the adhesive stick to the support in the step of transferring the electroconductive particles held on a support to the liquid adhesive surface, making it difficult to mold a film. When the content of electroconductive particles is increased, it becomes difficult to rightly fill the adhesive in the spaces between the electroconductive particles, so that it is required to strictly regulate the relation between the filled amount of electroconductive particles and the thickness of filmy adhesive before filling of electroconductive particles. It should be further noted that when the thickness of filmy adhesive is large, sticking of the adhesive to the support is unavoidable and when the thickness is small, the desired film strength may not be obtained or the particles may fall off the film.

In the conventional method of exposing electroconductive particles on both sides of the film by means of rolling, it is difficult to uniformly reduce the film thickness to the order of several ten microns by reducing the size of electroconductive particles in conformity to the high-fineness electrodes, and variation in size of electroconductive particles causes corresponding scatter of film thickness.

In the method of forming a film by casting a homogeneous mixture of a liquid resin and electroconductive particles, when the casting thickness is enlarged for increasing the fill of particles in the lower layer of the resin film molding by sedimentation of electroconductive particles, there is inevitably constituted a multilayer structure of electroconductive particles, and as a result, the particles which take no part in making the film electroconductive in the thickness direction are increased. Also, in this method, the resin layer which must be removed later is thick, making it difficult to uniformly expose the particles on the film surface.

In the film forming method in which a liquid resin is filled between a pair of flat plates with electroconductive particles held therebetween, the viscosity of the liquid resin must be extremely low for filling the resin in a small gap of plates, and variation in size of electroconductive particles may cause flowing out of electroconductive particles. In case of exposing electroconductive particles on the film surface by dissolving away the resin on the particle surfaces with a solvent, the solution of the dissolved film-forming resin adheres to the film surface and, when dried, forms a thin film on the particle surface to impair electrical connection. Also, since the thickness of film-forming resin must be strictly controlled by treating time or treating temperature, scatter of thickness from lot to lot or scatter of partial thickness of the film tends to occur.

In the method in which the film-forming resin is decomposed with a solvent, the film-forming resins decomposable with a solvent and the solvents usable therefor are restricted, and care is required in treatment when using an acidic or alkaline solvent. In this case, too, the thickness of film-forming resin needs to be strictly controlled by treating time or treating temperature, so that there tends to arise scatter of thickness from lot to lot or scatter of partial thickness of the film.

In the method comprising physical removal of resin by means of sputter etching, plasma etching or excimer laser irradiation, the apparatus is expensive, the treating time is long because of batch process, resulting in an elevated production cost, and this method can hardly be applied to a production process for massive products.

According to any of the conventional methods such as described above, care must be taken for correct removal of the desired thickness of film-forming resin in the step of exposing electroconductive particles, and it is very difficult to expose electroconductive particles by controlling the resin removal rate on both sides of the film. The object can hardly be accomplished unless at least the electroconductive particles are distributed in the same plane.

In the connection of fine electrodes in a functional test before mounting electronic parts such as LCD, TAB integrated circuits, bare chip integrated circuits, etc., there have been the problems such as inability of prior art to adapt itself to high fineness of electrodes, high cost, and poor electrical connection due to inability to absorb difference in height of electrodes. Specifically, in the connection mechanism using probes, since probes must be press-contacted with the respective electrodes, such probes are required to be fine in structure in correspondence to high fineness of the electrodes used, so that high-degree techniques are required for producing the probes. Also, it is not easy to arrange a plurality of probes in alignment with electrodes and this leads to an increased production cost. The method using an anisotropically electroconductive rubber sheet was also incapable of adapting itself to the mechanism involving high-fineness electrode and had the problems such as inability to retain insulation between adjoining electrodes and high connection resistance. In the case of an anisotropically electroconductive rubber sheet in which electroconductive particles are localized at the position corresponding to the electrodes, the electrode surface may be contaminated with organic matter, and in case an oxide layer is provided, it is hard to remove the surface insulating layer and the connection resistance is high.

In the case of the connecting system in which a conductive pattern formed on a flexible film is directly contacted with the electrode section of an electronic part to be tested, or in the case of the connecting mechanism in which an anisotropically electroconductive film having protuberant electrodes extending through an insulating polymer film is held between the part to be tested and a printed substrate for testing, since said conductive pattern and protuberant electrodes are made of a metal such as copper or gold and limited in amount of elastic deformation, variation in height of electrodes of the part to be tested must be compensated by bending deformation due to flexibility of the connected substrate and flexibility of the film substrate, and when this variation is large, the connecting performance lowers. In the ordinary printed wiring boards or integrated circuits, since solder resist or insulating protective film is present between the electrodes, the electrodes are in most cases positioned lower than said resist or protective film surface, so that the position of protuberant electrode is limited to the defined area.

SUMMARY OF THE INVENTION

The present invention has been made to overcome the prior art problems such as mentioned above, and it has for its object to provide a novel process for producing an anisotropically electroconductive resin film adhesive capable of forming electrical connection even with minute electrodes, a connecting method using said resin film adhesive, and a novel connected structure capable of making reliable low-resistance electrical connection even with minute electrodes.

The present invention provides a process for producing an anisotropically electroconductive resin film which comprises the steps of sticking electroconductive particles to a sticking layer and filling a film-forming resin which is incompatible with the sticking material among the electroconductive particles, characterized in that the resulting electroconductive resin film has electroconductivity only in the film thickness direction via the electroconductive particles uniformly dispersed in the plane direction, and is able to be used for obtaining electrical connection of oppositely placed fine electrodes of a plurality of electronic parts.

The present invention also provides a process for electrically connecting circuits, which comprises placing said anisotropically electroconductive resin film between circuits placed oppositely, and heating the anisotropically electroconductive resin film from a smaller concentration side of electroconductive particles, followed by heating under pressure.

The present invention further provides a fine electrode connected structure obtained by placing oppositely fine electrodes of a plurality of electronic parts on the substantially same plane, and sandwiching between said oppositely placed electrodes said anisotropically electroconductive film having electroconductivity only in the thickness direction via the electroconductive particles having elasticity exposed to the air on front and rear sides of said film to provide electrical connection.

The present invention also provides a process for using said fine electrode connected structure for testing display of a liquid crystal display, operation of an element constituting the liquid crystal display, a bare chip integrated circuit or a TAB integrated circuit, or electroconductivity of a printed wiring board.

BRIEF DESCRIPTION OF THE DRAWINGS

FIGS. 2A, 2B, 2C, 2D, 2E, 2F, 2G, 2H, 2I, 2J, 2K and 2L are schematic sectional views illustrating a production process of an anisotropically electroconductive resin film according to the prior art and a mode of connection using said resin film.

DESCRIPTION OF THE PREFERRED EMBODIMENTS

Figure 1A:
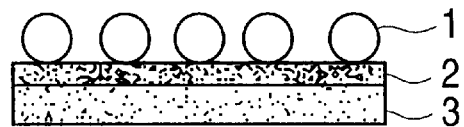
FIGS. 1A, 1B, 1C, 1D, 1E, 1F, 1G, 1H, 1I, 1J, 1K, 1L, 1M, 1N, 1O, 1P, 1Q and 1R are schematic sectional views illustrating a production process of an anisotropically electroconductive resin film according to the present invention and a mode of connection using said resin film.

The present invention comprehends the following embodiments.

(1) A process for producing an anisotropically electroconductive resin film having electroconductivity only in the thickness direction via the electroconductive particles uniformly dispersed in the plane direction and used for the purpose of obtaining electrical connection between the oppositely placed electrodes of a plurality of electronic parts having fine electrodes, which comprises the steps of sticking electroconductive particles to a sticking layer on a support and fixing therein, and filling a film-forming resin which is incompatible with the sticking material among the electroconductive particles.

(2) A process set forth in (1) above, wherein the film-forming resin is an insulating adhesive.

(3) A process set forth in (1) or (2) above, wherein the obtained anisotropically electroconductive resin film has electroconductivity only in the thickness direction via the electroconductive particles exposed to the air on front and rear surfaces of said film.

(4) A process set forth in any of (1) to (3) above, wherein the electroconductive particles are sticked and fixed on the sticking layer in the holes of a film or a net previously placed on the sticking layer.

(5) A process set forth in (4) above, wherein in the obtained anisotropically electroconductive resin film, the electroconductive particles are arranged in a grid or zigzag pattern in the plane by means of a film or net having the holes arranged in a grid or zigzag pattern in the plane.

(6) A process set forth in any of (3) to (5) above, wherein the sticking layer and the support thereof are light transmissible and the film-forming resin is a photo-curable resin, which is cured by exposing to light from the light transmissible sticking layer side.

(7) A process set forth in any of (1) to (6) above, comprising a step of forming a layer of electroconductive particles having a thickness larger than the particle size of the electroconductive particles on the sticking layer, and pressing the electroconductive particle layer against the stickening layer so as to bury the electroconductive particles to the depth of a half or less of the particle size of the electroconductive particles.

(8) A process set forth in any of (1) to (7) above, wherein the electroconductive particles and the sticking material, or the electroconductive particles and the porous film or net are electrostatically charged with different electric charges to form an electroconductive particle layer by dispersing the electroconductive particles on the sticking layer by electrostatic force.

(9) A process set forth in any of (1) to (8) above, wherein the electroconductive particles are covered with an electrically insulating layer removable with heating or pressing.

(10) A process set forth in any of (3) to (9) above, wherein the electroconductive particles are previously covered with an electrically insulating layer and the electrically insulating layer exposed on the front and rear sides of the resin film is removed.

(11) A process set forth in any of (6) to (10) above, wherein the light is electron beams and the film-forming resin is cured thereby.

(12) A process set forth in any of (2), (4), (5) and (7) to (9), wherein the electroconductive particles are dispersed with different concentrations in the film thickness direction.

(13) A process set forth in (12) above, wherein the film-forming resin has a thickness necessary for giving a volume almost the same as the volume of a space formed when opposite circuits are contacted for indexing electrodes.

(14) A process for electrically connecting oppositely placed circuits by heating under pressure using an anisotropically electroconductive resin film obtained by the process of set forth in (12) or (13), characterized by heating the anisotropically electroconductive resin film from the smaller concentration side of electroconductive particles.

(15) A fine electrode connected structure obtained by placing oppositely fine electrodes of a plurality of electronic parts on the substantially same plane, and sandwiching between said oppositely placed electrodes an anisotropically electroconductive resin film having electroconductivity only in the thickness direction via the electroconductive particles having elasticity and exposed to the air on front and rear sides of a film-forming resin layer obtained from the process of any of (3) to (11).

(16) A structure set forth in (15) above, wherein the electroconductive particles have a standard deviation of particle size distribution of 10% or less of the average particle size.

(17) A structure set forth in (15) or (16), wherein the electroconductive particles are plastic particles covered with a thin film of metal.

(18) A structure set forth in (17) above, wherein the metal is principally Au or Pt.

(19) A structure set forth in any of (15) to (18) above, wherein the electroconductive particles are plastic particles having fine pores in the surface, or interconnected fine pores between the surface and the interior thereof, a part or whole of said pores being covered with a metal or filled with a metal.

(20) A structure set forth in any of (15) to (19) above, wherein the electroconductive particles have fine bumps on the surfaces.

(21) A structure set forth in (20) above, wherein said fine bumps are formed by depositing fine particles of silica, glass or Ni having a particle size of $1/10$ or less of that of the electroconductive particles on the surfaces of the electroconductive particles, and covering the surfaces of said particles with an electroconductive thin film.

(22) A structure set forth in any of (15) to (21), wherein the anisotropically electroconductive resin film contains electroconductive particles positioned so as to meet the positions of electrodes connected.

(23) A structure set forth in any of (15) to (22), wherein one or both of the oppositely placed substrates are made of a highly elastic material selected from glass and ceramic.

(24) A structure set forth in any of (15) to (23), wherein electrodes formed on one or both of the substrates are positioned lower than the substrate surface level.

(25) A structure set forth in any of (15) to (24), wherein electrodes formed on one or both of the substrates are thin film electrodes produced by plating, vacuum evaporation or sputtering.

(26) A structure set forth in any of (15) to (25), wherein the difference in height of neighboring electrodes on a substrate is 10 $\mu$m or less, and the electroconductive particles have an average particle size of 100 $\mu$m or less.

(27) A structure set forth in any of (15) to (26), wherein at least one of the substrates and the anisotropically electroconductive resin film are fixed by means of sandwiching or adhesion.

(28) A structure set forth in any of (15) to (27), wherein the electronic part is a liquid crystal display, a bare chip integrated circuit, a TAB integrated circuit or a printed wiring board.

(29) A process for using the structure set forth in any of (15) to (28) above for testing display of a liquid crystal display, operation of an element constituting the liquid crystal display, a bare chip integrated circuit, operation of a TAB integrated circuit, or electroconductivity of a printed wiring board.

According to the present invention, a resin film having electroconductivity in the thickness direction alone is produced from a process comprising the steps of applying electroconductive particles on an sticking material surface and fixing them with said electroconductive particles being oriented in the plane direction on the adhesive surface, and then coating thereon a film-forming resin solution which is incompatible with the adhesive. Due to use of a film-forming resin as insulating adhesive, it is possible to obtain an anisotropically electroconductive resin film-like adhesive that can be used for connection of fine electrodes, and by removing only the film forming resin on the electroconductive particles on one side of the film, there can be obtained an anisotropically electroconductive resin film with the electroconductive particles exposed on both front and rear sides of the film. Further, by using a photocurable resin as the film-forming resin and curing said film-forming resin by applying light from the adhesive-applied side of the film, it is possible to easily and surely remove the film-forming resin on the electroconductive particles and to obtain an anisotropically electroconductive resin film having the electroconductive particles exposed on both front and rear sides of the film.

Thus, according to the process of the present invention, electroconductive particles are applied and fixed on an adhesive surface, then a photocurable film-forming resin incompatible with the adhesive is cast to fill up the spaces between the particles, and light is applied from the adhesive side to cure the film-forming resin. Then the film is immersed in a solvent to dissolve away the non-cured portion of the film-forming resin. Since the resin portion shielded from light by the electroconductive particles remains uncured, only the electroconductive particle surfaces from which the resin has been dissolved away are exposed. The cured film-forming resin is dried and peeled from the adhesive to provide an anisotropically electroconductive resin film with the electroconductive particles exposed on both sides of the film. When electron beam irradiation is employed for curing, it is possible to adjust the cured thickness of the film-forming resin by changing the electron acceleration voltage, which makes it possible to obtain an anisotropically electroconductive resin film of a desired thickness having the electroconductive particles exposed on the film surface. In the present invention, by placing a film or net (this instrument is hereinafter referred to as mask) on the adhesive surface and applying electroconductive particles thereon, it is possible to have said electroconductive particles adhered to the adhesive surface alone in the pores and to dispose the electroconductive particles at any position in the film plane. This makes it possible to control insulation in the plane direction of the film or to dispose the electroconductive particles only in the electrode area of the circuit in the film plane.

For example, by defining the film pores to be a size that won't allow adhesion of more than two electroconductive particles on the adhesive surface, there can be obtained an anisotropically electroconductive resin film in which the individual particles are insulated from each other. It is also possible to improve orientation density in the plane direction of electroconductive particles by pressing said particles against the adhesive surface by a rubber roll or other means, and to improve electroconductivity in the thickness direction of the film by removing the superfluous particles which are not fixed to the adhesive surface. Further, by embedding the electroconductive particles in the adhesive layer by adjusting the pressing force, it is possible to obtain a structure in which the electroconductive particles project from the resin film molding surface, and to improve electrical connecting performance when the electrodes are made conductive by contact.

It is also possible to sequentially arrange a determined amount of electroconductive particles by electrically charging the electroconductive particles and the adhesive surface or the electroconductive particles and the mask with different electric charges to have the electroconductive particles adsorbed on the adhesive surface and then fixing them. By using the electroconductive particles having their surfaces coated with an insulating layer made of a thermoplastic resin or the like which can be removed by heating or pressing, insulation in the plane direction can be maintained even if the electroconductive particles are in a state of being packed densely in the plane direction of the film. With reference to an anisotropically electroconductive resin film using electroconductive particles coated with an insulating layer, such film can be made into one which allows electric conduction between the electrodes by removing the insulating layer of electroconductive particles exposed on both front and rear sides of the film and contacting the electrodes with both sides of the film.

In use of an anisotropically electroconductive adhesive of the present invention for film formation, by applying said adhesive so that it will have a thickness necessary for giving a volume almost the same as the volume of a space formed when opposite circuits are contacted for indexing electrodes, there can be obtained a connected structure having no void at the connecting section and little squeeze-out of adhesive, which makes it possible to prevent reduction of connection reliability due to penetration of moisture or shorting of the adjoining circuits due to flow of the electroconductive particles when connection is formed. Also, by increasing the coating thickness of the adhesive, there can be obtained a two-layer structured film having an adhesive layer provided on the layer of electroconductive particles. In this film, the adhesive layer having no electroconductive particles is lower in melt viscosity than the layer packed with electroconductive particles, so that the adhesive layer is more liable to flow into the recess between the electrodes, checking flow of the electroconductive particles into such recess. This minimizes the risk of short-circuiting between the adjoining electrodes and increases the number of the particles which contribute to electric conduction. The above effect can further be enhanced when the two layers are pressedly attached to each other by heating from the adhesive layer side at the time of connection, since the adhesive layer side is first melted and flows into the recess between the electrodes.

The anisotropically electroconductive resin film according to the present invention has a structure in which the electroconductive particles having elasticity in the plane direction of the film are dispersed as a monolayer and the surfaces of the individual electroconductive particles are partly exposed or protuberant from both sides of the film, so that by applying this resin film for making electrical connection between the electrode section of an electronic part having a fine electrode, which is to be tested, and a testing substrate connected to a tester having the opposite electrode, it is possible to conduct various tests such as display test of LCD, operation test of the elements composing LCD, operation test of bare chip integrated circuits and TAB integrated circuits, and conduction test of printed wiring boards, etc., which has been difficult to carry out with the conventional methods.

The type of the electroconductive particles used in the present invention is not particularly limited; metal, glass, ceramic and plastic particles having a metal deposit on the surface can be used either singly or in admixture. Aggregates of small-sized electroconductive particles are also usable. The particle size may be properly selected depending on the fineness of the circuits to be connected, but it should be as uniform as possible. The particle shape is preferably spherical for uniformalizing the particle size for connection of fine electrodes. Usually, spherical plastic particles having metal deposit on the surface are used for connecting very fine electrodes. Where use of metal particles is required for the reason of heat resistance, etc., it is recommended to use the particles produced by gas atomization or rotary electrode atomization method as these particles are close to perfectly spherical in shape. It is also possible to use amorphous particles such as metal powders produced by water atomization method if these particles are uniformalized in size by classification or other means. Electroconductive particles of the type having a major axis are also usable in the present invention. The commercially available short metal fibers and glass fibers which have been subjected to metal plating on the surface, carbon fibers and the like can also be used. The diameter and length of the fibers used may be properly decided according to fineness of the electrodes to be connected, but it is desirable that the fibers used be uniform in length for better conductivity. Also, use of fibers with small and uniform diameter is recommended for better applicability to fine electrode connection.

The electroconductive particles having elasticity used in the present invention are also not subject to any specific restrictions; particles made of electroconductive rubber or plastic, metal-deposited rubber and plastic particles and the like can be used singly or in admixture. As for elasticity, the wider the range of elastic deformation with electroconductivity unchanged, the more absorbed is variation of electrode height or variation of electroconductive particle size, resulting in better electrical connection. Use of plastic particles having metal deposit on the surface is preferred as such plastic particles with various moduli of elasticity are commercially available and also various metals can be employed for plating. Various metals can be used either singly or in combination for plating, such as Ni-Au or solder alloys, but it is desirable to use a metal having high malleability such as Au or Pt or an alloy with high malleability as such metal can follow elastic deformation of electroconductive particles. The electroconductive particles to which electroconductivity has been imparted by plating can be secured against peel of the metal deposit on particle deformation by using the plastic particles having pores in the surface and plating the inside of these pores. Further, by making the porous structure of the plastic particles sponge-like to allow intercommunication of the surface and the inside of the particle and plating the inside of the pores, there can be obtained the electroconductive particles having conductive passages in the inside. These electroconductive particles are proof against reduction of electroconductivity due to separation of the surface electroconductive layer and also lower in resistance than the electroconductive rubber particles loaded with an electroconductive filler. In case the electrode to be connected has on its surface a thin insulating film made of an organic material or a metal oxide, it is recommended to provide fine bumps on the surfaces of the electroconductive particles so that when connection is made such insulating film will be broken by said bumps of the particles to provide stabilized connection with low resistance. A material which is solid and low in malleability is suited for said fine bumps, so that the electroconductive particles with excellent conductivity and desired bumps can be obtained by depositing a material different from the plating metal of the electroconductive particles on the particle surface. Various methods are available for forming said bumps. For example, metal particles are precipitated in the course of plating of the electroconductive particles and the precipitated metal particles are secured to the surface of the electroconductive particles, or plating of the electroconductive particles is carried out in a bath in which fine particles of an inorganic material such as silica or a metal such as Ni are dispersed and the dispersed particles are deposited on the surface of the electroconductive particles. The size of the electroconductive particles may be properly selected according to fineness of the electrodes to be connected, but it should be as uniform as possible. In view of use of the present invention for connection of fine electrodes, the particle size is preferably 5 to 100 μm. As for particle size distribution, it is desirable that the particles are of a uniform size with a standard deviation of less than 10%. The particle shape is preferably spherical for uniformalizing the particle size for connection of fine electrodes.

For providing electrical insulation in the plane direction in case no mask is used for controlling the fixed position of electroconductive particles, it is necessary to adjust dispersion of electroconductive particles on the sticking layer. When the contacting parts of electroconductive particles increase, electrical insulation in the plane direction is impaired. Therefore, in order to obtain electroconductive points with high density, an electrically insulating layer is provided on the surfaces of the individual electroconductive particles. The insulating layer contains a resin incompatible with the film-forming resin and can be constituted as a monolayer or multilayer structure. The term "incompatible" used in this invention means that the two resins have no affinity for each other and don't form a homogeneous mixture. Usually the SP value (solubility parameter, explained in detail in Adhesion Handbook, 2nd Ed., p 46, compiled by Japan Adhesion Association) is used as a measure of compatibility. The greater the difference in SP value of the two resins, the less compatible are these resins. Generally, when the difference is 1.0 or greater, the two resins are scarcely compatible with each other. The difference in heat melting temperature or heat softening temperature of the two resins is also a factor to be considered in deciding whether these resins form a homogeneous mixture or not. Generally, when such difference is 10° C. or greater, the two resins form no homogeneous mixture. These guide lines differ delicately from material to material, so that the respective materials used need to be examined individually. What is important is that since a film is usually formed by casting a solution of a film-forming resin dissolved and diluted with an appropriate solvent to have a pertinent viscosity, the insulating layer is made of a resin which won't dissolve in the solvent used for film forming or in the liquid component in the film-forming resin, that is, a resin insoluble in the film-forming resin solution. Various combinations of resins which are incompatible with each other can be used for forming an electrically insulating layer which won't dissolve in the film-forming resin solution by selecting an appropriate solvent. Resins usable in the present invention include thermoplastic polyurethanes, soluble nylons, epoxy resins, phenoxy resins, polyethylenes, polyesters and the like, and actually those which are insoluble in the film-forming resin solution and capable of forming an insulating layer with ease are selected. These barometers, however, differ delicately from material to material, so that the materials must be examined individually. The thickness of the insulating layer varies in its optimal value depending on the degree of insolubility of the resin in the film-forming resin solution and the degree of covering of electroconductive particles, but generally the insulating layer thickness is preferably 0.01 to 10 μm. Wet and dry processes can be employed for forming the electrically insulating layer. In a wet process, for example, the surfaces of electroconductive particles are coated with a solution of resin and then dried. In a dry process, the particles of resin forming the insulating layer and the electroconductive particles are let impinge against each other at high speed or mixed and ground or fused and stuck to each other. In a wet process, resin must be dissolved in an appropriate solvent, but this process is advantageous in that the insulating layer can be easily formed to a desired thickness, especially a thickness of submicron order. Dry process has the advantage that it is capable of forming the insulating layer even with resins hardly soluble in solvents, and is suited for forming an insulating layer with a thickness greater than 1 μm.

Various methods are available for forming aggregates of fine electroconductive particles dispersed in the insulating layer. For example, in a wet process, the surfaces of electroconductive particles are coated with a dispersion of fine electroconductive particles in a resin solution which is to form the insulating layer. In a dry process, the particles of resin forming the insulating layer and the fine electroconductive particles are let impinge against each other at high speed, or mixed and ground or fused and stuck to each other so that the fine electroconductive particles will be embedded in the insulating layer. A method can also be employed in which the insulating covered electroconductive particles forming the insulating layer according to a wet process and the fine electroconductive particles are treated by a dry process and the fine electroconductive particles are embedded in the insulating layer.

In the present invention, the sticking material is merely required to keep the electroconductive particles immobile during handling of the particles or coating of the film-forming resin after dispersion of the particles by making use of stickiness of the sticking material, and it is not required to give a sense of tackiness on touch with hand. Generally, a larger contact area between the electroconductive particle surfaces and the sticking agent provides a greater holding force for the electroconductive particles, so that a soft material that can fill up the recesses in the electroconductive particle surfaces at the time of dispersion of the electroconductive particles can be used as sticking agent in the present invention. In other words, a material capable of holding the elctroconductive particles immobile by virtue of its adhesive force to the electroconductive particles during handling of the particles or coating of the film-forming agent can be used as sticking material in the present invention. Such materials include rubbers such as SBR, polyisobutylene, polybutene, natural rubber, neoprene, butyl rubber, etc., and resins such as acryl resin, silicone resin, fluorine resin, etc. Mixtures of these resins or non-adhesive resins with a tackifier such as terpene resin or indene resin are also usable. These resins may be crosslinked to have a reticulate structure for reducing compatibility with the film-forming adhesive. A sticking material such as mentioned above is coated on a substrate film, plate, roll or the like to form a composite structure for facilitating handling of the substrate. Usually films of polyethylene terephthalate (PET), polyethylene, polypropylene and the like are used as substrate. When a photocurable film-forming resin is used, both of said sticking material and substrate film can transmit ultraviolet rays to cure the ultraviolet-curable film-forming resin. In case electron rays are used as light, it is possible to use colored films of Teflon, polyimide or the like as well as filled films in addition to said substrate films.

The film-forming resin used in the present invention functions as a binder of electroconductive particles and can be molded into a film. This resin needs to be one which is incompatible with the sticking material for preventing the sticking material which has stuck to and fixed the electroconductive particles during coating of the film-forming resin from being dissolved to cause movement of the electroconductive particles. The film-forming resins usable in the present invention include various types of synthetic resins and elastomers soluble in solvents, thermoplastic resins such as polyethylene, vinyl acetate and polypropylene, highly heat-resistant resins such as polyether sulfone, polyetherimide and polyimide, heat-curable resins such as epoxy resin and phenol resin, photocurable resins having acryloyl groups such as polyesteracrylate, urethane acrylate and epoxy acrylate, and photocurable resins containing compounds having sinnamoyl groups, diazo groups or azido groups. These photocurable resins may be used in admixture with thermoplastic resins such as polyethylene, vinyl acetate and polypropylene, highly heat-resistant resins such as polyether sulfone, polyether-imide and polyimide, thermosetting resins such as epoxy resin and phenol resin, or elastomers. In case of applying ultraviolet irradiation for curing, it is possible to change the cured film thickness or the curing rate by using a photo-initiator such as benzoin, benzophenone, Michler's ketone or the like and if necessary sensitizer such as an amine compound (e.g. triethylamine), a sulfur compound or a phosphorus compound.

As for combination of a film-forming resin and a sticking material which are incompatible with each other, there can be used, for instance, a combination of a sticking material with a small SP value such as polyisobutylene and a resin with a large SP value such as polyamic acid which is a precursor of polyimide. Silicone resins and fluorine resins are incompatible with many other resins, so that when these resins are used as sticking material, it is possible to opt a variety of resins as sticking material.

In case of using an anisotropically electroconductive film of the present invention for both purposes of electrical connection between the electrodes and adhesion of the electrodes, it is also possible to effectuate curing after flowing the film-forming resin between the electrodes by using said film-forming resin and applying heat or light while pressing the electrodes against each other. Of said film-forming resins, thermosetting resin is preferably used as part of the film-forming resin since this resin is cured while forming a network structure by heating under pressure at the time of circuit connection and can therefore provide a film with excellent heat resistance and high connection reliability.

The thickness of the film-forming resin in case of using an anisotropically electroconductive film of this invention for both purposes of electrical connection between the electrodes and adhesion of electrodes is not critical, but the optimal film thickness is decided from the amount of space formed when the circuits to be connected are contacted and fixed. For instance, in case of connecting a flexible wiring board having a plurality of 35 $\mu$m thick and 50 $\mu$m wide parallel-arranged copper electrodes at a pitch of 100 $\mu$m and a glass substrate having the same arrangement of transparent electrodes with a thickness of 1 $\mu$m or less, the appropriate thickness of the film having 10 $\mu$m electroconductive particles blended therein is 15 to 40 $\mu$m. In this case, since the electroconductive particles are held between the circuits and an adhesive layer is formed therebetween, it is necessary to take into consideration not only the size of the electroconductive particles but also their deformability and the depth of the particles embedded in the circuits. The thickness of the resin film having the electroconductive particles exposed on both sides of the film is also not limited in this invention, but it should be noted that an increase of the thickness entails a corresponding enlargement of the size of the electroconductive particles used, resulting in a reduced resolution, so that a large film thickness is unsuited for connection of fine circuits. On the other hand, a small thickness discommodes handling of the film and makes it difficult to produce the desired film due to wrinkling or other troubles. Thus, the preferred thickness of the film is 0.005 to 1 mm.

Commonly used ultraviolet light, such as generated from a mercury lamp or an electrodeless lamp, can be used a slight for curing the photocurable film-forming resin. It is also possible to use electron beam. Use of electron beam is advantageous in that the cured film thickness can be easily increased or decreased by adjusting the accelerating voltage of electron beam. In conducting this light irradiation, light needs to be applied from the substrate side of the film-forming resin so that the portion shaded by the electroconductive particles will be kept in an uncured state, so that the light applied is preferably parallel rays of light which enter the film-forming resin coated surface vertically thereto. In this case, the film-forming resin in the hemispherical portion shaded by the electroconductive particles remains uncured if no influence is given by diffraction or reflection of light. In case of employing a radical reaction for curing, oxygen serves as a reaction inhibitor, so that the amount of oxygen in the irradiation atmosphere gives an influence on curing of the film-forming resin. This influence is greatest at the film surface contacting the irradiation atmosphere and smallest on the light-transmissible base film side. Therefore, exposure of the electroconductive particles can be controlled by changing the oxygen density in the atmosphere. That is, the electroconductive particle surfaces can be exposed even by application of a small quantity of light from the electroconductive particle side, and the mechanical retention of electroconductive particles can be improved by holding the electroconductive particles with a film-forming resin of a thickness equal to or greater than semisphere of electroconductive particles. However, since the influence of oxygen on curing of the film-forming resin is greatly affected by the type and content of film-forming resin, photo-initiator and sensitizer, it is necessary to make a close examination of these matters in each blending system. In either case, it is imperative that curing of the film-forming resin be accomplished principally by light irradiation from the substrate side, with the film-forming resin on the electroconductive particles being left in an uncured state because of interception of light by the electroconductive particles and capable of being easily removed.

As mask, there can be used, for example, a net-like fabric woven with silk, nylon or stainless fibers, a so-called metal mask comprising a thin plate of stainless steel or nickel perforated at the desired positions with a desired size by etching or other means, and a mesh made by Ni or Cu plating. In use, mask is placed on the sticking layer. For dispersing the electroconductive particles by electrostatic force, the mask is electrically charged to have the electroconductive particles attracted to the mask surface and then stuck to the sticking layer in the pores of the mask by a blade or other means. For allowing efficient adhesion of the electroconductive particles on the sticking layer in the pores of the mask, it is desirable to control electrical charging of the mask by selecting an appropriate mask material or by earthing so that the electroconductive particles will be disposed only at and around the pores of the mask. Even in this case, the electroconductive particles deposited on the mask due to nonuniform charging potential of the mask in the mask plane can be brought into the pores by a blade or other means, or the superfluous electroconductive particles can be eliminated. The nets used for sieving or such purposes, even those made of a non-electroconductive material such as nylon, are usually provided with an antistatic treatment, so that such nets are useful as they can prevent the particles from depositing on the mask. The pores in the mask are usually of a size that allows passage of electroconductive particles, and the mask is removed after the electroconductive particles have been stuck on the sticking layer, but the pores may be of a size that won't allow passage of the electroconductive particles. What is essential is that the electroconductive particles be disposed at the position of pores in the mask, with part of the particles being contacted with the sticking material and fixed by its sticking force. For instance, electroconductive particles are dispersed on the sticking layer with a mask placed thereon, and after the electroconductive particles have been fixed in the pores of the mask, a film-forming resin is applied without removing the mask, thereby obtaining an anisotropically electroconductive resin film. The mask is removed from the film-forming resin surface of the obtained anisotropically electroconductive resin film and can be reused. Since the above process includes no step in which the electroconductive particles are passed through the pores in the mask, the electroconductive particles may have a size greater than the mask pores.

A corona charging device is usually used for effecting electrostatic charging, and the object of the present invention can be also accomplished by use of this device. This device is capable of electrically charging a material without contact, and the charging rate can be controlled at a desired level constantly with monitoring. Desired electrical charging can also be accomplished by a contact charging method in which a voltage-applied electroconductive roller or brush is contacted with the material. Such charging needs to be applied only on the necessary part of the sticking layer and mask where electroconductive particles are dispersed, and the potential difference with the electroconductive particles is merely required to be of a value sufficient to cause movement and adsorption of electroconductive particles. It is possible to charge the electroconductive particles themselves, but in this case care should be taken since the electroconductive particles may be scattered due to electrostatic repulsion between the particles, or variation of charging rate among the individual particles is enlarged. Electrical charging of usually several hundred volts or above is required for attaining the object of the present invention.

Regarding arrangement of electroconductive particles on the film surface, one or more electroconductive particles may be disposed corresponding to the position of each electrode to be connected, or they may be disposed in a grid or zigzag pattern at a constant pitch to unnecessitate positioning of electroconductive particles and electrodes, but usually particle arrangement is properly selected in consideration of fineness of the electrodes and size or distribution density of electroconductive particles.

In use of the anisotropically electroconductive resin film of the present invention, it may be filled between the circuits to be connected and heated or irradiated with light to cure the film-forming resin contained therein for using the resin as an electrical connecting material or adhesive. In the case of the anisotropically electroconductive resin film of this invention in which the electroconductive particles are exposed on both sides of the film, the molding of the present invention may be filled between the circuits to be connected and then pressed to make electrical connection. It is possible to perpetually retain electrical connection between the electrodes by fixing the electrodes in a pressed state by a pressing fixture, or by filling a liquid adhesive between the electrodes in a pressed state and fixing them, or by heating or irradiating with light the film material filled between the electrodes in a pressed state to cure the film-forming resin. In this case, since the electroconductive particles are held by the film-forming resin, the particles won't be caused to move due to flow resistance of the adhesive, so that a high-viscosity adhesive can be used.

In utilization of the connected structure according to the present invention for testing of electronic parts, a testing substrate is used for making electrical connection between a fine electrode of an electronic part, which is the object to be tested, and an electrode of a device for issuing input signal of said object or taking in output signal. Generally, printed circuit boards (PCB), flexible printed circuits (FPC) or like electrode substrates can be used, but a glass or ceramic substrate having a thin-film electrode formed thereon is most preferably used as such substrate has excellent flatness, is minimized in scatter of electrode height, allows easy formation of fine electrodes and has excellent dimensional stability against temperature and humidity. The substrate is properly selected according to the purpose of use; PCB or FPC substrate can be selected for their advantages of double-side printing or multilayer lamination of circuits and good workability. Transparent glass substrate has the advantage of allowing easy positioning of the electrodes. It is desirable that difference in height of adjoining electrodes is less than 10 $\mu$m, preferably less than 1 $\mu$m. Various methods such as etching of metal foil, plating, vacuum evaporation, sputtering, etc., or a combination of these methods may be employed for making electrodes. Plating, deposition or sputtering is suited for making fine electrodes, while etching of metal foil with low resistance is recommended for forming rough circuits or electrodes with a large thickness. The connected structure according to the present invention can be applied to a variety of electronic parts such as liquid crystal display panels, bare chip integrated circuits, TAB integrated circuits, printed wiring boards and the like, and is especially useful for liquid crystal displays, bare chip integrated circuits and TAB integrated circuits which have many fine electrodes and where scatter of height of adjoining electrodes is small. It is desirable that difference in height of adjoining electrodes be less than 10 $\mu$m, preferably less than 1 $\mu$m. An anisotropically electroconductive resin film may be adhered to the electrode portion on the testing substrate side alone to improve handling characteristics.

The resin film according to the present invention can be applied not only for connection of circuits described above but can also as well be applied to switching members, multilayer circuities and the like.

According to the present invention, a high-resolution anisotropically electroconductive resin film having electroconductive particles uniformly dispersed in the plane direction can be obtained, and the fine electrode connected structure of this invention using said resin film is capable of forming more reliable electrical connection between finer electrodes than possible with the conventional structures.

Hereinafter, the principle of the present invention is described in further detail with reference to the accompanying drawings, in which the reference numerals designate the following materials or parts.

1: electroconductive particles
2: sticking material
3: substrate film supporting sticking layer
4: mask
5: photocurable resin
6: light
7: rubber roll
8: electroconductive particles covered with electrically insulating layer
9: circuit 1
10: electrode 1
11: circuit 2
12: electrode 2
13: film substrate of anisotropically conductive resin film
14: electron beam
15: hot plate
16: platen
17: space between electrodes
18: elastic electroconductive particles
19: solder resist
20: adhesive
21: film substrate solution of anisotropically electroconductive resin film
22: polyisobutylene sticking material
23: PET film
24: portion poorly conductive due to void Referring to FIG. 3, there is shown a production process of an anisotropically electroconductive resin film of this invention using an insulating adhesive for the film-forming resin and a connecting procedure. The process is described step by step below to elucidate the effect of the present invention.

Figure 3A:
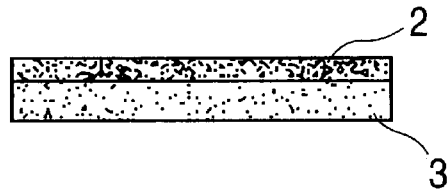
FIGS. 3A, 3B, 3C, 3D, 3E and 3F, FIGS. 4A, 4B, 4C, 4D, 4E, 4F and 4G and FIGS. 5A, 5B, 5C, 5D, 5E, 5F and 5G are schematic sectional views illustrating the production processes of anisotropically electroconductive resin films according to the present invention and the modes of connection using said resin films, said processes being shown stepwise.
Figure 3B:
Figure 3C:
Figure 3D:
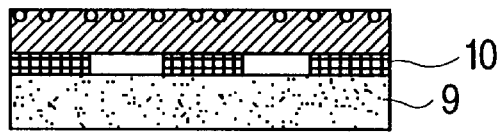

First, as shown in FIG. 3A, a sticking layer is provided on a substrate resin film by coating or other means, and then, as shown in FIG. 3B, electroconductive particles are spread over said sticking layer and fixed thereto by virtue of sticking force of the sticking material. Next, as shown in FIG. 3C, a film-forming adhesive solution is applied, filling the spaces between the electroconductive particles. Since the electroconductive particles are fixed on the sticking layer, they won't move in the film-forming adhesive solution, so that there takes place no agglomeration of particles during coating and the particles are uniformly arranged on a plane. Then the solvent is dried away to form a film-forming adhesive layer. For connecting circuits, as shown in FIG. 3D, the film is pressed against the surface of one of the circuits and peeled along the interface between the film-forming adhesive layer and the sticking layer, and the anisotropically electroconductive resin film adhesive is transferred. Since the film-forming adhesive and the sticking material are incompatible with each other, their layers can be easily separated from each other along the interface.

Figure 3E:
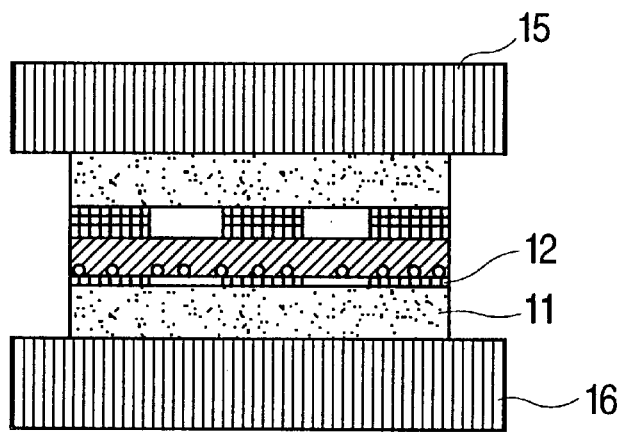

Then as shown in FIG. 3E, the electrodes of both circuits are positioned in registration with each other and both circuits are pressed or heated under pressure and thereby connected to become electrically conductive. In case the circuits are heated under pressure for connection, a hot plate is pressed against the film side with fewer electroconductive particles.

Figure 3F:
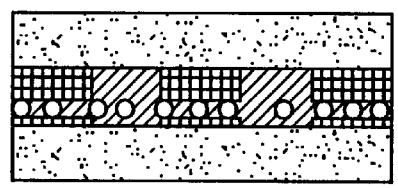

FIG. 3F shows a situation where an anisotropically electroconductive resin film adhesive of this invention was disposed between two circuits and they were pressed together to provide electrical connection between the circuits.

Figure 2A:
Figure 2B:
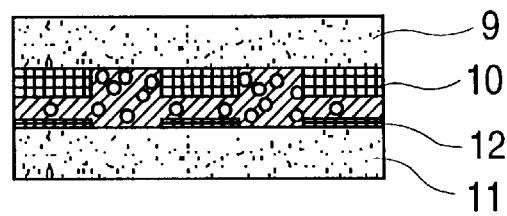

FIG. 2A shows an anisotropically electroconductive resin film adhesive obtained according to a conventional production process, and FIG. 2B shows a situation where this adhesive was disposed between circuits and they were pressed together to form electrical connection. According to the conventional method, when the density of electroconductive articles contributing to electrical conduction in the thickness direction of the film is low and the circuits to be connected are fine, it is hardly possible to obtain secure connection. Also, because of large inflow of electroconductive particles into the spaces between the electrodes, short-circuiting tends to take place between the adjoining circuits. The electroconductive particles which flowed into the spaces between the electrodes make no contribution to electrical connection of circuits. According to the method of the present invention, the number of these particles can be lessened to allow a significant cost reduction. Also, the process of this invention can eliminate the above prior art problems to enable secure electrical connection of fine circuits.

Referring now to FIG. 4, there is shown a process for producing an anisotropically electroconductive resin film of this invention in which electroconductive particles are exposed to the air on both sides of the film-forming resin layer and a connection scheme using said film. This process is described step by step below to elucidate the principle of the present invention.

Figure 4A:
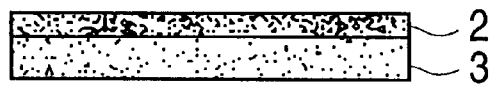
Figure 4B:
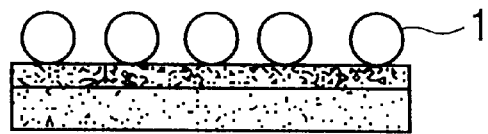
Figure 4C:
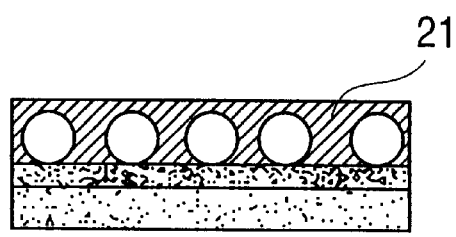
Figure 4D:
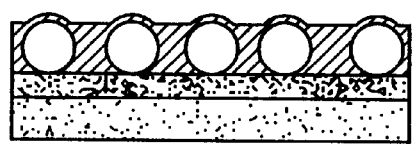
Figure 4E:
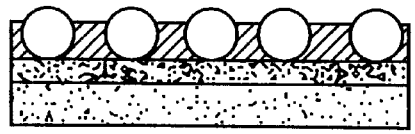
Figure 4F:

First, as shown in FIG. 4A, a sticking layer is provided on a substrate resin film by coating, and then as shown in FIG. 4B, electroconductive particles are spread on said sticking layer and fixed thereto by virtue of sticking force of the sticking material. Next, as shown in FIG. 4C, a film-forming resin solution is applied, filling the spaces between the electroconductive particles. Since the electroconductive particles are fixed on the sticking layer, they won't move in the film-forming resin solution, so that there takes place no agglomeration of particles during coating and the particles are uniformly arranged on a plane. Then, as shown in FIG. 4D, the film-forming resin is dried or cured, followed by removal of the film-forming resin covering the electroconductive particles by dissolution or other physical means to have the electroconductive particles exposed on the film surface as shown in FIG. 4E. Thereafter, the film is peeled along the interface between the film-forming resin layer and the sticking layer to give an anisotropically electroconductive resin film such as shown in FIG. 4F. Since the film-forming resin and the sticking material are incompatible with each other, their layers can be easily separated along the interface. Also, as the electroconductive particles are in contact with the sticking layer, said particles stay exposed on the peeled surface of the film-forming resin layer, so that partial removal of film-forming resin for exposing electroconductive particles is merely required to conduct on one side (film-forming resin coated side in FIG. 4D) alone of the film. In this case, since the electroconductive particles are distributed only in the same plane on the sticking-layer, the thickness of the film substrate can be regulated to a minimum necessary value. Also, the amount of the film-forming resin to be removed for exposing the electroconductive particles can be minimized and removal of the resin can be accomplished accurately with ease. When partial removal of film-forming resin is carried out in a state where the specimen is supported by the substrate film and sticking layer, it is possible to prevent damage or elongation of the film-forming resin layer and fall-off of electroconductive particles. Also, even if the film is peeled along the interface between the substrate film and the sticking layer in a state where adhesive force between the sticking layer and the substrate film is weak and the substrate film is attached closely to the film-forming resin layer, it is possible to dissolve away only the sticking layer by selecting a proper solvent since the film-forming resin and the sticking material are incompatible with each other, and a desired anisotropically electroconductive resin film can be obtained.

Figure 4G:
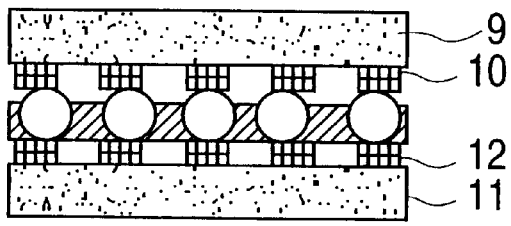

FIG. 4G shows a connection scheme where an anisotropically electroconductive resin film of this invention was disposed between circuits and they were pressed together to make electrical connection.

FIG. 2I shows a scheme where an anisotropically electroconductive resin film obtained according to a conventional process was disposed between circuits and they were pressed together to form electrical connection. According to the conventional method, when the density of the electroconductive particles contributing to electrical conduction in the thickness direction of the film is low and the circuits to be connected are fine, it is hardly possible to obtain desired connection of circuits. Also, because of large unevenness of the film surface, it is difficult to obtain contact with the electrodes on the circuits. According to the process of the present invention, the above problems are eliminated to allow secure electrical connection of fine circuits.

FIG. 5 shows a production process of an anisotropically electroconductive resin film of this invention using a photocurable film-forming resin with the electroconductive particles being exposed on both sides of the film-forming resin layer, and a connection scheme using said film. This process is explained step by step below.

Figure 5A:
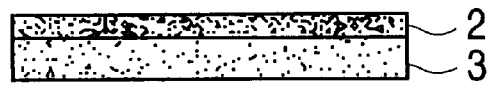
Figure 5B:
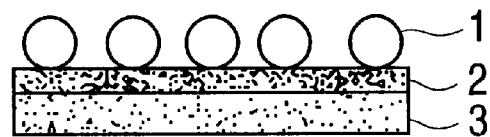
Figure 5C:
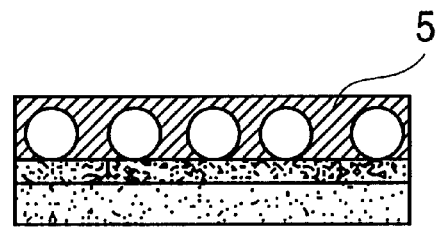
Figure 5D:
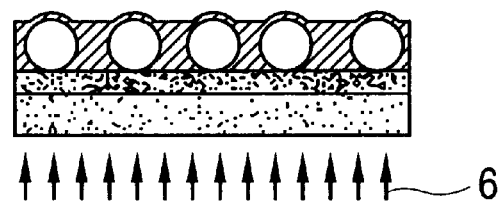
Figure 5E:
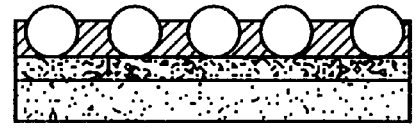
Figure 5F:

First, as shown in FIG. 5A, a sticking material is solution coated on a light-transmissible resin film substrate to form a sticking layer, and then as shown in FIG. 5B, electroconductive particles are spread over said sticking layer and fixed thereto by virtue of sticking force of the sticking agent. Next, as shown in FIG. 5C, a photocurable film-forming resin solution is applied, filling the spaces between the electroconductive particles. Since the electroconductive particles are fixed on the sticking layer, they won't move in the film-forming resin solution, so that there takes place no agglomeration of particles during coating and the particles are kept uniformly arranged on a plane. Then, as shown in FIG. 5D, light is applied from the light-transmissible substrate side to cure the film-forming resin. The portion shielded from light by the electroconductive particles remains uncured. The uncured film-forming resin covering the electroconductive particles is dissolved away with a solvent to have the electroconductive particles exposed on the film surface as shown in FIG. 5E. Thereafter, the film is peeled along the interface between the film-forming resin layer and the sticking layer to give an anisotropically electroconductive resin film such as shown in FIG. 5F. Peeling along the interface can be easily accomplished since the film-forming resin and the sticking material are incompatible with each other. Also, as the electroconductive particles are in contact with the sticking layer, the electroconductive particles can be exposed on the peeled surface of the film-forming resin layer. Further, even if the film is peeled between the substrate film and the sticking material in a state where adhesive force between the sticking layer and the substrate film is weak and the substrate film is attached closely to the film-forming resin layer, it is possible to dissolve away the sticking layer alone by selecting a proper solvent since the film-forming resin and the sticking material are incompatible with each other, and a desired anisotropically electroconductive resin film can be obtained.

Figure 5G:
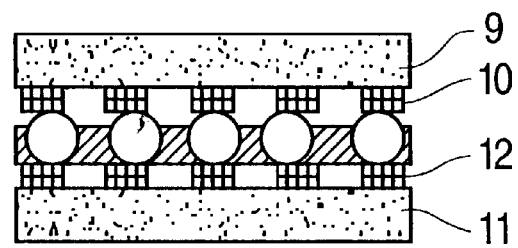

FIG. 5G shows a connection scheme where an anisotropically electroconductive resin film of the present invention was disposed between circuits and they were pressed together to form electrical connection.

FIG. 1A shows a step associated with the afore-said embodiment (1) of this invention in the above-described process for producing an anisotropically electroconductive resin film, in which the electroconductive particles have been spread over the sticking layer. Here, the electrconductive particles are fixed by virtue of sticking force of the sticking material.

Figure 1B:
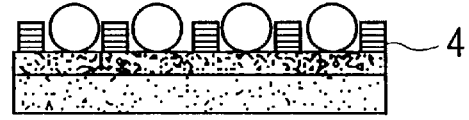

FIG. 1B shows a step associated with the embodiment (2) in the process of producing an anisotropically electroconductive resin film according to the present invention, in which the electroconductive particles are fixed to the sticking layer in the pores of the mask placed on the sticking layer. Electroconductive particles are moved rolling on the mask by a brush or other means and can be set in the pores of the mask. There can thus be obtained an anisotropically electroconductive resin film in which electroconductive particles are present in a desired arrangement on the film plane.

Figure 1C:
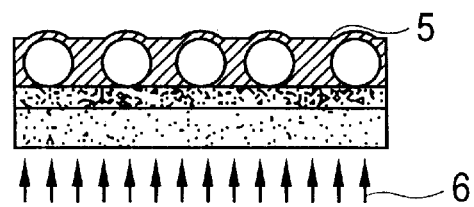

FIG. 1C shows a step associated with the embodiment (6) in the process for producing an anisotropically electroconductive resin film of the present invention, in which electroconductive particles are fixed on the sticking layer and light is applied from the light-transmissible substrate side to cure the film-forming resin. The portion of the resin shielded from light by the electroconductive particles remains uncured.

Figure 1D:
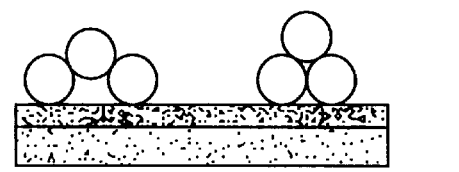
Figure 1E:
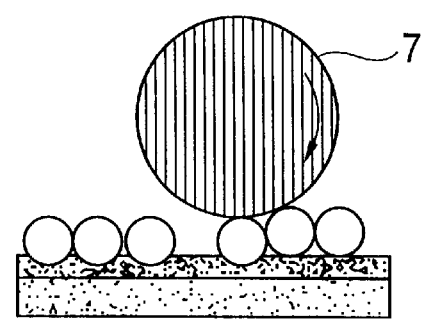

FIGS. 1D and 1E show the steps associated with the embodiment (7) in the process for producing an anisotropically electroconductive resin film according to the present invention, in which an electroconductive particle layer is provided on the sticking layer to a thickness greater than the electroconductive particle size and pressed into the sticking layer. In the step of FIG. 1D, an electroconductive particle layer is provided on the sticking layer to a thickness greater than the electroconductive particle size, and in the step of FIG. 1E, the electroconductive particle layer is pressed into the sticking layer so that the individual particles will be buried in the sticking layer to a depth of a half or less of the electroconductive particle size. By these steps, the contact area between the electroconductive particles and the sticking layer is enlarged to ensure uniform and secure fixing of the electroconductive particles, and also the electroconductive particles held between other particles and not contacted with the sticking layer are pressed and forcibly contacted with the sticking layer to increase the density of electroconductive particles in the anisotropically electroconductive resin film. Also, since the electroconductive particles not in contact with the sticking layer can be reduced, it becomes easy to remove the superfluous electroconductive particles which don't contribute to electrical conduction. Further, by embedding the electroconductive particles in the sticking layer, there can be produced a structure in which electroconductive particles project from the film surface at the plane contacted with the sticking layer of the produced anisotropically electroconductive resin film to ensure electrical connection between electrodes and electroconductive particles. Further, since the embedded depth of electroconductive particles can be freely decided by hanging the pressing force, it is possible to easily set the amount of projection of electroconductive particles at the optimum level.

Figure 1F:
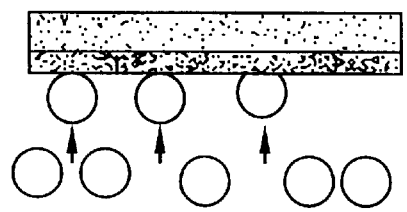
Figure 1G:
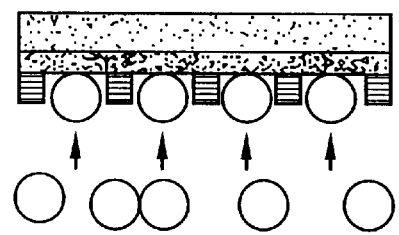

FIG. 1F shows a step associated with the embodiment (8) of the present invention, in which the electroconductive particles and the sticking material are electrostatically charged with different electric charges to form an electroconductive particle layer by dispersing the electroconductive particles on the sticking layer by electrostatic force. Similarly, when the sticking layer electrostatically charged with the different charge from the electroconductive particles are brought close to the electroconductive particles as shown in FIG. 1G, the electroconductive particles are held on the sticking layer by the electrostatic force. In this case, electroconductive particles on the mask are attracted by the electrostatic force to the sticking layer at the position of pores of the mask exposed to the surface, and stay stuck only at the position of pores of the mask. The amount of particles carried on the mask can be lessened by reducing the amount of electric charge of the mask, and since the electroconductive particles are not stuck to the mask, they can be easily removed by air blow or brushing. It is thus possible to obtain an anisotropically electroconductive resin film containing electroconductive particles arranged uniformly on the film plane.

Figure 1H:
Figure 1I:
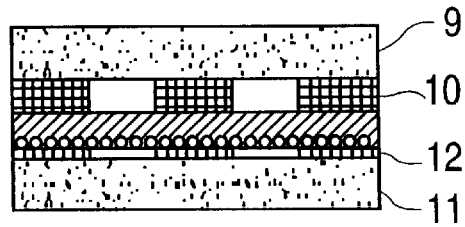
Figure 1J:
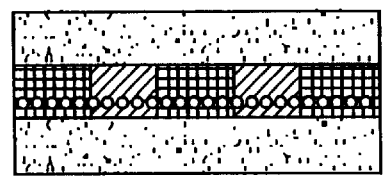

FIGS. 1H, 1I and 1J show the steps associated with the embodiment (9) of this invention in which the electroconductive particles are the particles, or aggregates thereof, covered with an electrically insulating layer which can be easily removed by heating or pressing. In the step of FIG. 1H, the electroconductive particles covered with an insulating layer are spread over the sticking layer. In the step of FIG. 1I, the specimen is disposed between the circuits to be connected, and in the step of FIG. 1J, the insulating layer is caused to move by heating under pressure to make electrical connection between the circuits. Since the insulating layer is insoluble in the film-forming adhesive solution, the insulating layer remains retained as it is in the film-forming adhesive solution. Also, since the particles are fixed to the sticking layer, they won't agglomerate with each other in the film-forming adhesive and are dispersed uniformly on the film plane. Therefore, even if the electroconductive particles are filled densely to contact with each other, their electrical insulation in the plane direction is maintained by the electrically insulating layer between the particles. Electrical connection between the opposing electrodes can be obtained by removing the insulating layer on the particle surface by pressing or heating under pressure.

Figure 1K:
Figure 1L:

FIGS. 1K and 1L show the steps relating to the embodiment (10) in which the electroconductive particles covered with an electrically insulating layer are used and the electrically insulating layer of the electroconductive particles exposed on both front and rear sides of the resin film are removed. FIG. 1K shows a film molding obtained by using the electroconductive particles covered with an electrically insulating layer, and FIG. 1L shows a state where the electrically insulating layer exposed on the film surface has been eliminated. Since the insulating layer is insoluble in the film-forming resin solution, it stays retained as it is in the film-forming resin solution, so that even when the electroconductive particles are filled densely to contact each other, their insulation in the plane direction is maintained by the electrically insulating layer between the particles. Since a resin incompatible with the film-forming resin is selected as insulating layer material,it is possible to dissolve away only the insulating layer exposed on the film surface by using a proper solvent. According to this method, even in case it is difficult to remove the insulating layer when electrical connection is made, it is possible to employ an anisotropically electroconductive resin film with a high conductive point density by using the electroconductive particles covered with the insulating layer.

Figure 1M:
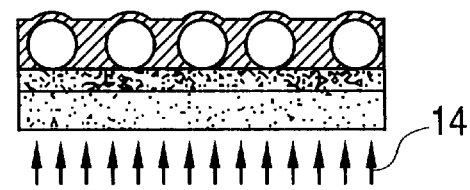

FIG. 1M is a drawing illustrating the embodiment (11) of this invention in which electron rays are applied from the light-transmissible substrate side to cure the film-forming resin. It is possible to adjust the film thickness to be cured to have the electroconductive particles exposed on thefilm-forming resin surface by controlling the electron ray irradiation energy. In case the electroconductive particles are the resin particles having a thin metal deposit on the surface to allow easy transmission of electron rays, the portion shielded from light by the electroconductive particles is also cured, making the electroconductive particles unliable to fall off the film.

Figure 1N:
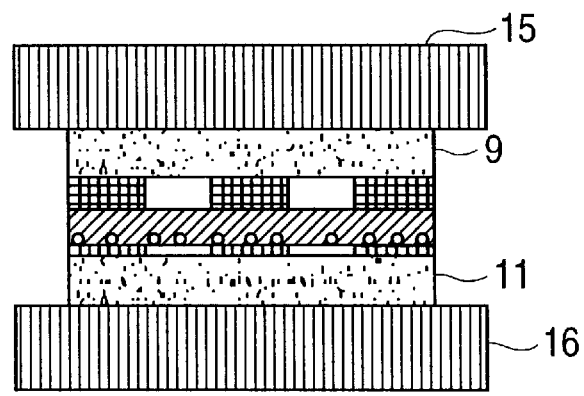
Figure 1O:
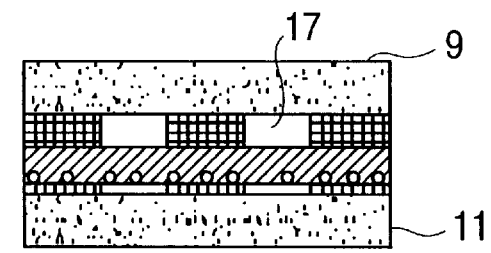

FIG. 1N shows a setup associated with the embodiments (12) and (14) of the present invention. When electrical connection is made by using an anisotropically electroconductive resin film in which the electroconductive particles are dispersed with different concentrations in the film thickness direction, since the layer filled with electroconductive particles become higher in melt viscosity than the adhesive layer, the fluidity is reduced and the adhesive alone is filled in the spaces between the electrodes, so that insulation between the adjoining circuits is retained more positively and the number of the electroconductive particles contributing to electrical conduction is increased. Also, when the heating and pressing fixture is so set that heating is made from the adhesive layer side, since the adhesive layer is first melted and brought into a fluid state, the effect of filling the adhesive alone in the spaces between the electrodes is promoted.

FIG. 10 shows a step associated with the embodiment (13) in which a film-forming adhesive has been disposed between circuits. Here, a film-forming adhesive having a thickness necessary for giving a volume almost the same as the volume of a space formed between the electrodes is used. After connection, there is provided a connected structure having no space between the circuits as shown in FIG. 3F.

Figure 1P:

FIG. 1P shows a sectional structure of an anisotropically electroconductive resin film using a film-forming resin which becomes adhesive when heated under pressure or irradiated with light, which is typical of the embodiments (2) and (3) of the present invention. It is possible to attain both adhesion of electrodes and electrical connection at the same time by using as film-forming resin a thermoplastic resin, a non-cured heat-curable resin or a photo-curable resin which is melted and cured on heating under pressure or irradiation with light. Specifically, electroconductive particles are held between electrodes in a state where an anisotropically electroconductive resin film of this invention has already been disposed and pressedly held between electrodes to provide electrical connection. Electroconductive particles are deformed or embedded in the electrodes by pressure to bring the electrodes and film-forming resin into a contacted state. The film-forming resin is cured by heating under pressure or irradiation with light to retain the electrodes in a bonded state. The step of electrical connection by pressure and the step of adhesion between electrodes by heating or light irradiation may be performed simultaneously. Also, a step of electrical functional test of the electronic parts to be connected may be incorporated between the above steps.

Figure 1Q:
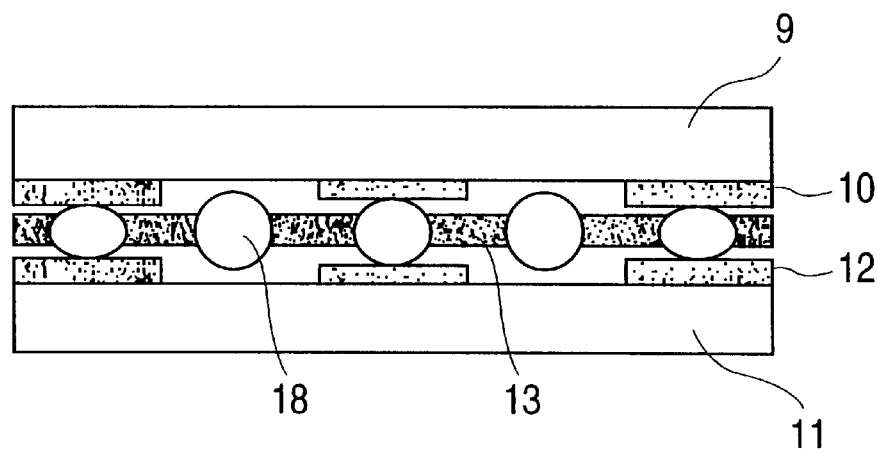

FIG. 1Q is a schematic sectional view of a fine electrode connected structure according to the embodiment (15) of the present invention. As an anisotropically electroconductive resin film is disposed between the opposing electrodes as shown in FIG. 1Q, the opposing electrodes become conductive. Since the electroconductive particles are the elastic particles subject to deformation on pressing, the electroconductive particles are deformed to make the electrodes conductive for sure despite scatter in height of the electrodes.

Figure 1R:
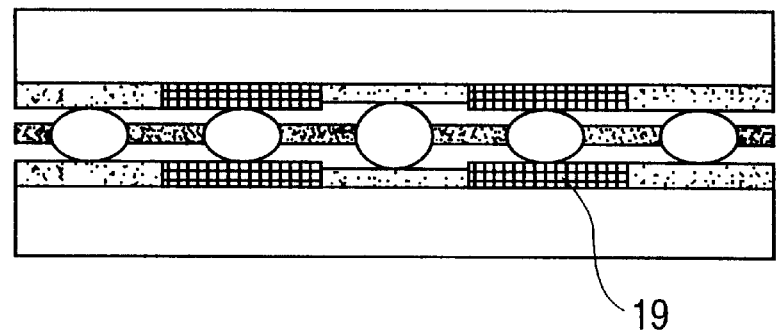

FIG. 1R shows a structure according to the embodiment (24) of the present invention, in which an insulating layer such as solder resist is provided between electrodes and the electroconductive particles are deformed even if the electrodes are not convex, so that there is no need of disposing electroconductive particles in the electrode portion alone. Of course, the electroconductive particles may be disposed in the electrode portion alone as in the case of the embodiment (22) by using a mask.

FIG. 2K is a sectional view of a connecting mechanism using conventional metal particles. In this case, since the metal particles are incapable of being elastically deformed to such an extent as to absorb scatter in height of electrodes or scatter in size of metal particles, such scatter must be counter valid by flexibility of the substrate or deformation due to flexibility of the film substrate which is a binder of metal particles. Consequently, the pitch between electrodes is reduced, and in case scatter of electrode height is large, the metal particles may not be contacted with the electrodes. In case an insulating layer such as solder resist is provided between electrodes and the electrodes are not convex as shown in FIG. 2L, if electronconductive particles exist between electrodes, it becomes unable to set up contact between electrodes and electroconductive particles, so that it is necessary to introduce electroconductive particles in the electrode portion alone.

It is desirable that the size of electroconductive particles is uniform as in the embodiment (16) because in this case it is only required to absorb scatter of electrode height by deformation. As for the material of electroconductive particles, it is possible to use electroconductive polymers or resins having an electroconductive filler dispersed therein. Especially use of plastic particles covered with a thin film of metal as in the embodiment (17) is recommended as they are commercially available. In this case, electroconductivity of the particles can be adjusted by the thin film of metal on the surface, while deformability and elasticity can be adjusted by the quality of plastic particles, so that an appropriate combination can be selected from a wide scope. The thin film of metal on the surface of electroconductive particles must be deformed with deformation of the particles, so that use of a metal or an alloy with high malleability such as Pt or Au (embodiment (18)) is recommended since use of such metal can minimize the risk of peel or cracking of the film when the electroconductive particles are deformed. An effective method for preventing peel or cracking of the metal film on the particle surface is to enhance the adhesive force by an anchor effect produced by the unevenness of the particle surface. By plating the plastic particles having fine pores on each surface as in the embodiment (19), a thin film of metal can be formed on the inside of the pores and a high adhesiveness can be obtained. If the pores are present not only in the surface but also in the interior of the particles and these pores are interconnected, electroconductive passages are formed in the inside of the particles and there can be obtained the deformable electroconductive particles having little possibility of causing crack or peel of the metal film on the particle surface. Use of such deformable electroconductive particles can eliminate the risk of causing deformation of the electrodes when contacted under pressure, so that the obtained connected structure is suited for testing of electronic parts. It often happens that the electrode surface be contaminated with organic matter or covered with a thin insulating layer of metal oxide during normal handling of electronic parts, and in some cases resistance is increased and no good connection can be obtained unless the clean electrodes are connected through the insulating layer. Such connection through the insulating layer can be obtained by adjusting rigidity of electroconductive particles, but an appropriate rigidity must be selected within limits not impairing the electrodes as discussed above. When fine bumps having a sufficient hardness to run through the insulating layer are provided in the thin metal layer on the surface of elctroconductive particles as in the embodiment (20), a large pressure is exerted to the bumps when the electrodes are connected and good electrical connection can be obtained regardless of ridity of electroconductive particles. If such fine bumps are electroconductive on the surface, the intended purpose can be achieved, so that the inside of the bumps may be non-electroconductive. For instance, the object can be attained by depositing fine silica or glass particles with ahigh hardness on the surfaces of electroconductive particles and covering the surfaces of the insulating fine particles by plating as in the embodiment (21). In case said bumps are provided by depositing fine electroconductive particles, it is recommended to use hard Ni particles having spine like bumps on the surface as such particles can easily penetrate the insulating layer on the electrode surface to provide good electrical connection. These bumps can be provided by other methods, such as forming unevenness on the plated surface by selecting the proper plating conditions, or by first forming bumpy oxide particles and then reducing them.

With an anisotropically electroconductive resin film having the electroconductive particles exposed on both sides of the film according to the present invention, it is possible to obtain a desired connected structure by providing an adhesive layer on the surface of said resin film for bonding and fixing the substrates, but it is also possible to obtain a detachable connected structure without bonding by making use of the advantage that electric conduction can be produced by contact alone. In case of using this detachable connection system for testing of electronic parts, since the electroconductive particles are deformable, it is possible to use not only a flexible testing substrate such as EPC substrate but also a hard substrate with low deformability such as PCB, glass or ceramic substrate as in the embodiment (23) of the present invention. The electrodes on the substrates may be ones produced by ordinary metal foil etching, but it is preferred to use thin film electrodes produced by plating, vacuum evaporation or sputtering of a conductive material for reducing scatter of electrode height on the testing substrates as in the embodiment (25). When the difference in height of neighboring electrodes on a substrate is 10 $\mu$m or less and the electroconductive particles have an average particle size of 100 $\mu$m or less as in the embodiment (26), good connection can be obtained and both requirements for securing insulation between electroconductive particles and providing fine connection can be met. Also, using an anisotropically electroconductive resin film of this invention by fixing it to a substrate as in the embodiment (27), even the thin films provided on the fine electrodes can be made tolerant of damage in the repeated connecting operations and the handling characteristics can be improved. This connected structure is especially suited for testing of electronic parts such as liquid crystal displays, bare chip integrated circuits, TAB integrated circuits, printed wiring boards, etc. (embodiments (28) and (29)) as scatter of electrode height is small in these electronic parts.

The present invention is described in further detail below with reference to the examples thereof, which examples are however merely intended to be illustrative and not to be construed as limiting the scope of the invention. The materials and the treating conditions used in the following Examples and Comparative Examples are as described below.

Sticking material: 10 μm thick polyisobutylene sticking material (VISTA NEX, a trade name, produced by Tonex Co., Ltd.) or 10 μm thick silicone type sticking material (TPR 6712, a trade name, produced by Toshiba Silicone Co., Ltd.) was coated on a 50 μm thick PET substrate film.

Electroconductive particles: Ni particles having an average size of 40 μm produced by gas atomization, plastic electroconductive particles produced by forming a 0.2 μm Au layer on the surfaces of polystyrene spherical particles having an average size of 10 μm and those having an average size of 40 μm, and plastic electroconductive particles produced by forming a 0.2 μm Au layer on the surfaces of spongy polystyrene spherical particles having pores of about 0.01 μm and an average particle size of 40 μm were used. Standard deviation of particle size distribution of the electroconductive particles using polystyrene spherical particles and spongy polystyrene spherical particles having an average size of 40 μm was 2 μm or less.

The surfaces of the electroconductive particles were covered with an electrically insulating covering material CM4000 (methanol-soluble nylon produced by Toray Industries,Inc.) using methanol as solvent by COATMIZER (a trade name, mfd. by FREUND Industries, Inc.) according to wet process to form an approximately 0.5 μm thick insulating layer.

For forming fine electroconductive bumps on the electroconductive particle surfaces, the surfaces of plastic particles were plated with Au in a plating solution having dispersed therein fine silica particles having a primary particle size of 0.04 μm or fine Ni particles having a primary particle size of about 3 μm.

Film-forming resin: Heat-curable epoxy resin obtained by coating and drying a toluene solution of a 50/20/20/10/2 mixture of Epikote 1001/Epikote 828/NIPOLE 1032 (nitrile rubber produced by Nippon Zeon Co., Ltd.)/HITANOL 2400 (alkylphenolproduced by Hitachi Chemical Co., Ltd.)/CURZOL 2PZ (2-phenylimidazole produced by Shikoku Chemical Industries Co.,Ltd.), polyimide resin obtained by coating, drying and imidizing a dimethylformamide (DMF) solution of polyamic acid, or urethane resin obtained by coating, drying and photocuring a methyl ethyl ketone solution of urethane acrylate oligomer (produced by Shin Nakamura Chemical Co., Ltd.) was used. For curing the film-forming resin by ultraviolet irradiation, benzophenone and Michler's ketone were used as photo-initiator in amounts of 4% and 1%, respectively, based on urethane acrylate oligomer.

Production process is described specifically in each Example. For coating of sticking material and film-forming resin solution, an applicator type coating machine was used. Drying after coating of heat-curable epoxy resin was carried out at 80° C. for 10 minutes. Drying of polyamic acid coating was conducted at 130° C. for 20 minutes and dehydration/imidation was carried out at 400° C. for 10 minutes. Ultraviolet irradiation for curing film-forming resin was conducted at a cumulative dose of 700 mJ for one-side exposure by using an ultraviolet exposing device (mfd. by Oak Seisakujo KK). Cured thickness of film-forming resin was expected to become substantially equal to the radius of particle at the part close to the particles, but the resin thickness became about 5 to 10 μm greater than the radius of particle under the influence of diffraction of light or reflection of light on the particle surface. However, film-forming resin at the part substantially shielded from light by the electroconductive particles, with said influence removed, was not cured and the electroconductive particle surface was exposed. Electron ray irradiation was performed by applying electron rays from the substrate film side by using an electron beam irradiator (mfd. by Iwasaki Electric Co., Ltd.). Cured thickness of film-forming resin can be adjusted by the accelerating voltage of electron rays and the thickness of substrate film or sticking layer through which electron rays are to pass, but when accelerating voltage was set at 160 kV and substrate film thickness at 100 μm, cured thickness of film-forming resin fell in the range of 30 to 35 μm, so these values were adopted as treating conditions.

For evaporation of anisotropically electroconductive resin film obtained by peeling from the interface with the sticking layer, in Examples 1–5 and Comparative Example 1, a flexible wiring board (FPC) having copper circuits with a line width of 50 μm, a pitch of 100 μm and a thickness of 35 μm with an overall circuit width of 50 mm and a glass substrate wiring board having transparent electrode circuits (indium tin oxide (ITO)) with a line width of 50 μm, a pitch of 100 μm and a thickness of 0.1 μm with an overall circuit width of 50 mm were positioned so that the circuits of both wiring boards opposed to each other, and the obtained anisotropically electroconductive resin film was disposed between the opposing circuits and kept under a pressed (10 kg/cm$^2$) and heated (170° C.) condition for 20 seconds to bond the circuits by the specimen. The apparatus used for this circuit bonding was of a structure in which the specimen is placed on a platen of room temperature and pressed from above by a hot plate heated to a prescribed temperature. The anisotropically electronconductive resin film (adhesive) was inserted with its side having fewer electroconductive particles placed upside so that the film would be heated from the adhesive-applied side.

In Examples 6–13 and Comparative Example 2, two FPC wiring boards were positioned so that their circuits opposed to each other, then the obtained anisotropically electroconductive resin film was disposed between the circuits and pressed at 10 kg/cm$^2$, and under this condition, connection resistance and insulation resistance were measured. In Example 11 using the electroconductive particles having insulating coat to be removed by heating under pressure, the specimen was placed between the circuits and kept under a pressed (10 kg/cm$^2$) and heated (150° C.) condition for 30 seconds to remove the insulating coat, followed by cooling to room temperature under pressure. In Example 13 intended to obtain mechanical connection by bonding the circuits simultaneously with electrical connection, measurement was made twice, first by placing the specimen between the circuits and keeping them under pressure (10 kg/cm$^2$) and the second time by bonding the circuits with the specimen under a pressed (10 kg/cm$^2$) and heated (170° C.) condition for 30 seconds and then cooling to room temperature under normal pressure.

In Examples 14–19 and Comparative Example 3, two FPC wiring boards having copper circuits with a line width of 100 μm, a pitch of 200 μm and a thickness of 35 μm with an overall circuit width of 50 mm were positioned to oppose the respective circuits, then the obtained anisotropically electroconductive resin film was disposed between the circuits to bond them under pressure of 10 kg/cm$^2$, and under this condition, connection resistance and insulation resistance were measured. In Example 18 using the electroconductive particles having insulating coat to be removed by heating under pressure, the specimen was disposed between the circuits, kept under a pressed (10 kg/cm$^2$) and heated (150° C.) condition for 30 seconds to remove the insulating coat, and then cooled to room temperature under pressure.

In Examples 20–22 and Comparative Example 4, there were used glass substrates having Au-plated 2-mm long electrodes with a line width of 50 μm, a pitch of 100 μm, a height of approximately 0.8 μm and a maximum difference in height between the neighboring electrodes of approximately 0.3 μm or less with an overall electrode width of 50 mm. These substrates were positioned with their electrodes opposed to each other, then the obtained anisotropically electroconductive resin film was disposed between the electrodes for bonding them under pressure of 10 kg/cm², and under this condition, connection resistance was measured.

In Examples 21 and 24 and Comparative Example 5, one of the glass substrates used in Example 20 was replaced by a printed substrate having a solder resist layer which was about 2 μm higher on the average than the electrode surface level. Electrodes were Cu electrodes with a height of 18 μm.

In Example 23, the glass substrates of Example 20 having Al electrodes with a height of about 0.7 μm were used.

In Example 25, the anisotropically electroconductive resin film obtained in Example 20 was bonded to one of the glass substrates with an epoxy adhesive by keeping them under a pressed (10 kg/cm²) and heated (170° C.) condition for 20 seconds, and then the film was pressed against the other glass substrate and left under this state.

In Example 26, an epoxy adhesive was applied to both sides of the anisotropically electroconductive resin film, and this film was placed between the opposing glass substrates (same as used in Example 20) and kept under a pressed (10 kg/cm²) and heated (170° C.) condition for 20 seconds to bond and fix said both glass substrates.

Connection resistance and insulation resistance were measured at room temperature under normal pressure. Specifically, connection resistance between a pair of substrates was measured by flowing an electric current of 1 mA while insulation resistance between the adjoining connected circuits was measured at by applying a voltage of 100 V. The obtained results in the Examples and Comparative Examples are shown in Table 1.

EXAMPLE 1

Using a dry particle spreader, plastic electroconductive particles having an average size of 10 μm were spread through a 20 μm-mesh screen over the silicone-based sticking material applied side of a PET film. Then a heat-curable epoxy resin solution was coated on the particle spread surface and dried. In this coating operation, the concentration of heat-curable epoxy resin and the coating gap of applicator were adjusted so as to obtain a film thickness of about 25 μm. Observation of the sectional shape of the obtained film confirmed that it was a two-layer structured film in which an approximately 15 μm heat-curable epoxy resin layer was formed on a layer of electroconductive particles fixed on the sticking layer of the base film. The two-layer structured film was stripped off from the interface with the sticking layer to obtain an anisotropically electroconductive resin film.

EXAMPLE 2

A mask (15 μm-mesh nylon subjected to an antistatic treatment) was attached tightly on the silicone-based sticking material applied side of a PET film, and using said dry particle spreader, plastic electroconductive particles having an average size of 10 μm were spread over the mask through a 20 μm-mesh screen. After spreading, the particles on the mask were moved rolling by using a destaticizing brush so that many particles would enter the pores in the mask. Then the particles staying unfixed to the sticking layer were removed by blowing compressed air and the mask was peeled from the sticking layer of the film. Thereafter, a heat-curable epoxy resin solution was coated on the particle-spread side of the film and dried.

EXAMPLE 3

Using a dry particle spreader, plastic electroconductive particles having an average size of 10 μm were spread through a 20 μm-mesh screen on the silicone-based sticking material applied side of a PET film. It was observed that about 3 to 10 pieces of spread electroconductive particles agglomerated each other to form many local stratiform portions. The particle spread side of the film was covered with a 25 μm PET film and pressed between rubber rolls under pressure of 1 kg/cm². Then the cover film was stripped off and the spread condition of electroconductive particles was observed. Electroconductive particles were found pressed against the sticking layer and fixed thereon substantially as a single layer. A heat-curable epoxy resin solution was coated on the particle spread surface of the film and dried.

EXAMPLE 4

Using a dry particle spreader, plastic electroconductive particles having an average size of 10 μm were spread over an aluminum foil through a 20 μm-mesh screen. A mask (15 μm mesh nylon) was attached tightly on the silicone-based sticking material applied side of a PET film and the mask side thereof was electrically charged to +3 kV by a corona charger. The masked PET film was positioned above the electroconductive particles spread side of the aluminum foil so that the masked side of the film opposed the electroconductive particle spread surface of PET film with a spacing of about 1 cm. Electroconductive particles on the aluminum foil were attracted into the pores in the mask by electrostatic force and fixed to the sticking layer. Since the electroconductive particles fixed to the sticking layer were electrically charged to a same potential, an electrostatic repulsive force was generated between the electroconductive particles, inhibiting the particles from agglomerating each other to form a single layer of particles. Then the mask was stripped off from the sticking layer and a heat-curable epoxy resin solution was coated on the particle spread surface of the film and dried.

EXAMPLE 5

Using a dry particle spreader, plastic electroconductive particles having an average size of 10 μm were spread through a 20 μm-mesh screen over the silicone-based sticking material applied side of a PET film. A heat-curable epoxy resin solution was coated on the particle spread side of the film and dried.

EXAMPLE 6

Using a dry particle spreader, Ni particles were spread through a 50 μm-mesh screen over the polyisobutylene applied side of a PET film. The particle spread side of the film was coated with a polyamic acid solution, and after drying, the coated side of the film was peeled from the interface with polyisobutylene and heat treated for imidization. This film had a thickness of about 25 μm at the polyimide portion. On the polyamic acid solution coated side of the film, the particle surfaces were covered with a thin film of polyimide, so that the film was immersed in an aqueous solution of sodium hydroxide to partially remove polyimide in the surface layer by decomposition to expose the particle surfaces.

EXAMPLE 7

A mask (50 μm-mesh nylon subjected to an antistatic treatment) was attached tightly on the polyisobutylene applied side of a PET film, and using a dry particle spreader, Ni particles were spread over the masked side of the film through a 50 μm-mesh screen. After spreading, the particles were moved rolling on the mask by using a destaticizing brush so that many particles would enter the pores in the mask. Then the particles staying unfixed to the sticking layer were removed by blowing compressed air and the mask was stripped off from the sticking layer of the film. The particle spread side of the film was coated with a polyamic acid solution, and after drying, the coated side of the film was peeled from the polyisobutylene interface and heat treated for imidization. This film had a thickness of about 25 μm at the polyimide portion. On the polyamic acid solution coated side of the film, the particle surfaces were covered with a thin film of polyimide, so that the film was immersed in an aqueous solution of sodium hydroxide to partially remove polyimide in the surface layer by decomposition to expose the particle surface.

EXAMPLE 8

Using a dry particle spreader, Ni particles were spread over the polyisobutylene applied side of a PET film through a 50 μm-mesh screen. There were may parts where the spread Ni particles agglomerated in groups of about 3 to 10 and stratified locally. A 25 μm PET cover film was placed over the particle spread side of the film and pressed between rubber rolls under pressure of 1 kg/cm². Then the cover film was stripped off and the Ni particle spread condition was observed. It was found that Ni particles were pressed into the sticking layer to form substantially a single layer of particles. A DMF solution of polyamic acid was coated on the Ni particle spread side of the film, and after drying, the coated side of the film was peeled from the polyisobutylene interface and heat treated for imidization. This film was approximately 25 μm thick at the polyimide portion. On the polyamic acid solution coated side of the film, Ni particles were found covered with a thin film of polyimide, so that the film was immersed in an aqueous solution of sodium hydroxide to partially remove polyimide in the surface layer by decomposition to expose the particle surface.

EXAMPLE 9

Using a dry particle spreader, Ni particles were spread over the polyisobutylene applied side of a PET film through a 50 μm-mesh screen. A 25 μm thick PET cover film was placed on the particle spread surface and pressed between rubber rolls under pressure of 5 kg/cm². Then the cover film was stripped off and the spread condition of Ni particles was observed. It was found that Ni particles were buried in the sticking layer to a depth of approximately 5 μm on the average as a single layer. A DMF solution of polyamic acid was coated on the particle spread side of the film, and after drying, the coated side of the film was peeled from the polyisobutylene side and heat treated for imidization. This film was approximately 25 μm thick at the polyimide portion. On the polyamic acid solution coated side of the film, the particles surfaces were covered with a thin film of polyimide, so that the film was immersed in an aqueous solution of sodium hydroxide to partially remove polyimide in the surface layer by decomposition to expose the particle surface.

EXAMPLE 10

Using a dry particle spreader, Ni particles were spread on an aluminum foil through a 50 μm-mesh screen. A mask (50 μm-mesh nylon) was attached tightly on the polyisobutylene applied side of a PET film, and the masked side of the film was electrically charged to +3 kV by a corona charger and positioned above the Ni particle spread surface of aluminum foil so that the masked side of the film would oppose the Ni particle spread surface with a spacing of about 1 cm. Ni particles on the aluminum foil were attracted into the pores of the mask by electrostatic force and fixed to the sticking layer. Since the Ni particles fixed to the sticking layer were electrically charged to a same potential, electrostatic repulsive force was generated between Ni particles, which helped to inhibit the particles from agglomerating each other to form a single layer of particles. Then the mask was stripped off the sticking layer. A polyamic acid solution was coated on the particle spread side of the film, and after drying, the coated side of the film was peeled from the polyisobutylene side and heat treated for imidization. This film was about 25 μm thick at the polyimide portion. On the polyamic acid solution coated side of the film, the particle surfaces were covered with a thin film of polyimide, so that the film was immersed in an aqueous solution of sodium hydroxide to partially remove polyimide in the surface layer by decomposition to expose the particle surfaces.

EXAMPLE 11

Using a dry particle spreader, electroconductive Ni particles having insulating coating were spread over the polyisobutylene applied side of a PET film through a 50 μm-mesh screen. A polyamic acid solution was coated on the particle spread side of the film and, after drying, the coated side of the film was peeled from the polyisobutylene side and heat treated for imidization. This film was approximately 25 μm thick at the polyimide portion. On the polyamic acid solution coated side of the film, the particle surface was covered with a thin film of polyimide, so that the film was immersed in an aqueous solution of sodium hydroxide to partially remove polyimide by decomposition to expose the particle surface. For evaluation of electrical properties of the obtained specimen, the specimen was placed between evaluation circuits, retained under a pressed (10 kg/cm²) and heated (150° C.) condition for 30 seconds and then cooled to room temperature under pressure. Observation of the circuit surface after evaluation confirmed no attachment of the insulating coating layer.

EXAMPLE 12

Using a dry particle spreader, electroconductive Ni particles having an insulating coating layer thereon were spread over the polyisobutylene applied side of a PET film through a 50 μm-mesh screen. A polyamic acid solution was coated on the particle spread side of the film, and after drying, the coated side of the film was peeled from the polyisobutylene side and heat treated for imidization. This film was approximately 25 μm thick at the polyimide portion. On the polyamic acid solution coated side of the film, the particle surface was covered with a thin film of polyimide, so that the film was immersed in an aqueous solution of sodium hydroxide to partially remove polyimide by decomposition to expose the particle surface. Then this specimen was immersed in methanol to dissolve away the insulating coating layer on the particles exposed on the surface. Evaluation of electrical properties of the obtained specimen was made by placing the specimen between evaluation circuits and applying pressure (10 kg/cm²) thereto.

EXAMPLE 13

Using a dry particle spreader, electroconductive plastic particles having an average size of 40 μm were spread over the silicone-based sticking material applied side of a PET film through a 50 μm-mesh screen. A heat-curable epoxy resin solution was coated on the particle spread side of the film and dried. This film was approximately 25 μm thick at the film-forming resin portion having no electroconductive plastic particles. On the film-forming resin applied side of the film, the particle surface was covered with a thin film of film-forming resin, so that the film was immersed in toluene and wiped several times with a nonwoven fabric. Since the electroconductive plastic particles were protuberant from the film surface, the thin film of film-forming resin could be easily removed. Then the film-forming resin side of the film was peeled from the sticking side to prepare a specimen for evaluation. Evaluation of electrical properties was made twice by placing the specimen between evaluation circuits and applying pressure (10 kg/cm$^2$) thereto and by retaining the specimen under a pressed (10 kg/cm$^2$) and heated (17° C.) condition for 30 seconds to bond the circuits with the specimen and then cooling to room temperature under normal pressure. After bonding, electroconductive particles were compression-deformed to a thickness of about 15 μm and the film-forming resin was filled between circuits and cured by crosslinking, whereby the circuits were strongly bonded.

EXAMPLE 14

Using a dry particle spreader, electroconductive plastic particles having an average size of 40 μm were spread over the silicone-based sticking material applied side of a PET film through a 50 μm-mesh screen. An urethane acrylate oligomer solution was coated on the particle spread side of the film and, after drying, irradiated with ultraviolet light to cure the film-forming resin. This film was immersed in propanol to dissolve away the uncured urethane acrylate oligomer, and after drying, the film was separated along the interface between the film-forming resin layer and the silicone sticking layer.

EXAMPLE 15

Using a dry particle spreader, electroconductive plastic particles having an average size of 40 μm were spread over the silicone sticking material applied side of a PET film through a 50 μm-mesh screen. There were many parts where the spread particles were agglomerated in groups of about 3 to 10 and stratified. A PET cover film was placed on the particle spread side of the film and pressed between rubber rolls under pressure of 1 kg/cm$^2$. Then the cover film was removed and the spread condition of electroconductive particles was observed. Electroconductive particles were found pressed into the sticking layer to form substantially a single layer of particles. An urethane acrylate oligomer solution was coated on the particle spread side of the film and, after drying, irradiated with ultraviolet light to cure the film-forming resin. This film was immersed in isopropanol to dissolve away the uncured urethane acrylate oligomer, and after drying, separated along the interface between the film-forming resin layer and the silicone sticking layer.

EXAMPLE 16

Using a dry particle spreader, electroconductive plastic particles having an average size of 40 μm were spread over the silicone sticking material applied side of a PET film through a 50 μm-mesh screen. A 25 μm PET cover film was placed on the particle spread side of the film and pressed between rubber rolls under pressure of 5 kg/cm$^2$. Then the cover film was removed and the spread condition of electroconductive particles was observed. Electroconductive particles were found buried to a depth of about 5 μm on the average in the sticking layer, forming substantially a single layer of particles. An urethane acrylate oligomer solution was coated on the particle spread side of the film, and after drying, ultraviolet light was applied to cure the film-forming resin. This film was immersed in isopropanol to dissolve away the uncured urethane acrylate oligomer and, after drying, separated along the interface between the film-forming resin layer and the silicone sticking layer.

EXAMPLE 17

Using a dry particle spreader, electroconductive plastic particles having an average size of 40 μm were spread over the silicone-based sticking material applied side of a PET film through a 50 μm-mesh screen. An urethane acrylate oligomer solution was coated on the particle spread side of the film and, after drying, irradiated with electron rays via the substrate film to cure the film-forming resin. This film was immersed in isopropanol to dissolve away the uncured urethane acrylate oligomer and, after drying, separated from the PET film.

EXAMPLE 18

Using a dry particle spreader, electroconductive plastic particles having an average size of 40 μm were spread over the silicone-based sticking material applied side of a PET film through a 50 μm-mesh screen. An urethane acrylate oligomer solution was coated on the particle spread side of the film and, after drying, exposed to ultraviolet light to cure the film-forming resin. This film was immersed in isopropanol to dissolve away the uncured urethane acrylate oligomer and, after drying, separated along the interface between the film-forming resin layer and the silicone sticking layer. For evaluating electrical properties of the obtained specimen, it was disposed between evaluation circuits, held under a pressed and heated condition for 30 seconds and then cooled to room temperature under pressure. Observation of the circuit surface after evaluation showed no attachment of the insulating coating layer.

EXAMPLE 19

Using a dry particle spreader, electroconductive plastic particles having an insulating coating layer thereof having an average size of 40 μm were spread over the silicone-based sticking material applied side of a PET film through a 50 μm-mesh screen. An urethane acrylate oligomer solution was coated on the particle spread side of the film and, after drying, irradiated with ultraviolet light to cure the film-forming resin. This film was immersed in isopropanol to dissolve away the uncured urethane acrylate oligomer and, after drying, separated along the interface between the film-forming resin layer and the silicone sticking layer. Then this specimen was immersed in methanol to dissolve away the insulating coating of the particles exposed on the surface.

EXAMPLE 20

Using a dry particle spreader, electroconductive plastic particles having an average size of 40 μm were spread over the silicone-based sticking material applied side of a PET film through an 80 μm-mesh screen. A 50 μm-mesh and 85 μm-pitch mask was attached tightly on the sticking side of the film and electroconductive particles were arranged in a grid pattern. An urethane acrylate oligomer solution containing a photo-curing agent was coated on the particle spread side of the film and, after drying, exposed to ultraviolet light to cure the film-forming resin. This film was immersed in isopropanol to dissolve away the uncured urethane acrylate oligomer and, after drying, separated along the interface between the film-forming resin layer and the silicone sticking layer. As the substrates to be connected, there were used glass substrates having 2 mm long Au-plated electrodes with a line width of 50 $\mu$m, a pitch of 100 $\mu$m, a height of about 0.8 $\mu$m and a maximum difference in height between the adjoining electrodes of about 0.3 $\mu$m with an overall electrode width of 50 mm. These substrates were position so that their respective electrodes opposed to each other, then the obtained anisotropically electroconductive resin film was disposed between the electrodes, the electrodes were pressed against each other under pressure of 10 kg/cm$^2$, and under this state, connection resistance between a pair of glass substrates was measured by applying an electric current of 1 mA.

EXAMPLE 21

In Example 20, one of the glass substrates was replaced by a printed substrate having a solder resist layer which was approximately 2 $\mu$m higher on the average than the electrode surface level. Electrodes were Cu electrodes having a height of 18 $\mu$m.

EXAMPLE 22

In Example 20, Au-plated spongy polystyrene particles having pores of approximately 0.01 $\mu$m were used as electroconductive particles.

EXAMPLE 23

In Example 20, as electroconductive particles, there were used plastic particles having an average size of 40 $\mu$m which have been Au plated in a plating solution having dispersed therein fine silica particles having a primary particle size of 0.04 $\mu$m so that the surfaces of electroconductive particles and the surfaces of fine silica particles deposited thereon would be covered by Au plating. Also, glass substrates were replaced by Al electrodes having a height of about 0.7 $\mu$m.

EXAMPLE 24

In Example 20, as electroconductive particles, there were used plastic particles having an average size of 40 $\mu$m which have been Au plated in a plating solution having dispersed therein fine Ni particles having a primary particle size of 3 $\mu$m so that the surfaces of electroconductive particles and the surfaces of fine Ni particles deposited thereon would be covered by Au plating. Also, one of the glass substrates used in Example 20 was replaced by a printed substrate having a solder resist layer positioned approximately 2 $\mu$m higher on the average than the electrode surface. Electrodes were Cu electrodes having a height of 18 $\mu$m.

EXAMPLE 25

The anisotropically electroconductive resin film obtained in Example 20 was cured and attached to one of the glass substrates with an epoxy adhesive under pressure, then pressed against the other glass substrate and maintained in this state.

EXAMPLE 26

An epoxy adhesive was applied to both sides of the anisotropically electroconductive resin film obtained in Example 20, and this adhesive film was held and cured between glass substrates under pressure to bond and fix both glass substrates.

COMPARATIVE EXAMPLE 1

As shown in FIG. 2A, electroconductive plastic particles having an average size of 10 $\mu$m were dispersed in a heat-curable epoxy resin solution in an amount of 30 vol %, and this dispersion was cast coated on a Teflon film by an applicator and dried. In the obtained film, there were many agglomerates of electroconductive particles and the surface unevenness was large, the average film thickness being about 25 $\mu$m.

COMPARATIVE EXAMPLE 2

Figure 2C:
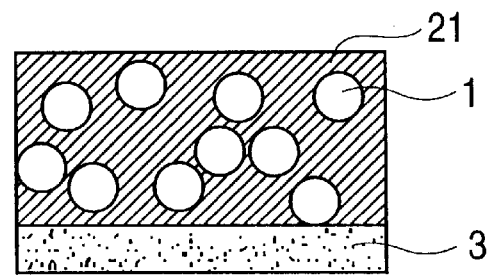
Figure 2D:
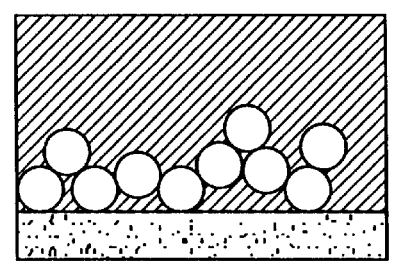
Figure 2E:
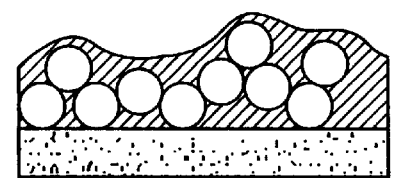
Figure 2F:
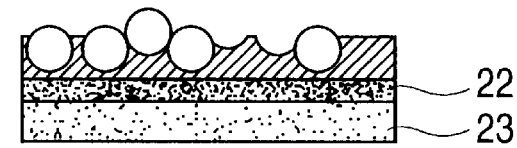
Figure 2G:
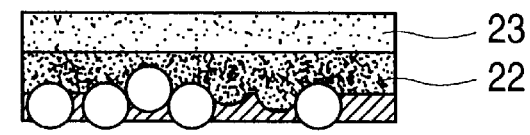

As shown in FIG. 2C, Ni particles were dispersed in a DMF solution of polyamic acid in an amount of 30 vol % and the dispersion was cast coated on a PET film by an applicator. Immediately after casting, sedimentation of electroconductive particles took place as shown in FIG. 2D. After drying, the coating was separated from the PET film and heat treated for imidization. In this film, as shown in FIG. 2E, there were many agglomerates of electroconductive particles and the surface unevenness was large, the average film thickness being about 70 $\mu$m. Since the particle surface was not exposed on both sides of the film, this film was immersed in an aqueous solution of sodium hydroxide to partially dissolve away the polyimide surface to reduce the thickness of the polyimide portion to an extent smaller than the size of electroconductive particles to thereby expose the particle surface. Since the better part of electroconductive particles in the film existed on the PET film side due to sedimentation of particles, a polyisobutylene-coated PET film was laminated on one side of the film and immersed in an aqueous solution of sodium hydroxide, with the polyimide decomposition rate on each side being adjusted by immersion time. These steps are illustrated in FIGS. 2F and 2G. In this case, the polyimide composition rate was adjusted by immersion time, but the film thickness of the polyimide portion between Ni particles scattered widely and the film strength reduced excessively. There are also the parts where no Ni particle surface was exposed. It was tried to reduce the coating thickness to decrease the amount of polyimide to be removed, but the particles agglomerated between the applicator and the PET film during coating to produce many ribs, making it unable to obtain a desired film. Evaluation of electrical properties of the obtained specimen shown in FIG. 2H was made by sandwiching the specimen between evaluation circuits and applying pressure (10 kg/cm$^2$) thereto as shown in FIG. 2I.

COMPARATIVE EXAMPLE 3

Electroconductive plastic particles having an average size of 40 $\mu$m were dispersed in an MEK solution of urethane acrylate oligomer in an amount of 10 vol %, and this dispersion was cast coated on a 50 $\mu$m thick PET film by an applicator. Immediately after casting, sedimentation of electroconductive particles took place. After drying, ultraviolet light was applied from both sides of the film in the usual way to cure the film-forming resin. The film was immersed in the solvents such as isopropanol, MEK and toluene, but the cured urethane acrylate oligomer could not be dissolved away and the particles remained unexposed as shown in FIG. 2J. After drying, PET film was removed. Electrical properties of the obtained specimen were evaluated by placing the specimen between evaluation circuits and applying pressure (10 kg/cm$^2$) thereto.

COMPARATIVE EXAMPLE 4

In Example 20, Ni particles having an average size of 40 µm were used as electroconductive particles.

COMPARATIVE EXAMPLE 5

In Example 20, Ni particles having an average size of 40 µm were used as electroconductive particles and one of the glass substrates was replaced by a printed substrate having a solder resist layer positioned approximately 2 µm higher on the average than the electrode surface. Electrodes were Cu electrodes having a height of 18 µm.

TABLE 1

|  | Occurrence rate of improper connection resistance (above 100 Ω) | Occurrence rate of improper insulation resistance (below $10^6$ Ω) |
| --- | --- | --- |
| Example 1 | 0 | 1 |
| Example 2 | 0 | 0 |
| Example 3 | 0 | 3 |
| Example 4 | 0 | 0 |
| Example 5 | 0 | 0 |
| Example 6 | 0 | 2 |
| Example 7 | 0 | 0 |
| Example 8 | 0 | 4 |
| Example 9 | 0 | 3 |
| Example 10 | 0 | 0 |
| Example 11 | 1 | 0 |
| Example 12 | 0 | 0 |
| During pressing in Example 13 | 0 | 0 |
| After heating under pressure in Example 13 | 0 | 0 |
| Example 14 | 0 | 2 |
| Example 15 | 0 | 2 |
| Example 16 | 0 | 3 |
| Example 17 | 0 | 1 |
| Example 18 | 0 | 0 |
| Example 19 | 0 | 0 |
| Example 20 | 0 | 0 |
| Example 21 | 0 | 0 |
| Example 22 | 0 | 0 |
| Example 23 | 0 | 0 |
| Example 24 | 0 | 0 |
| Example 25 | 0 | 0 |
| Example 26 | 0 | 0 |
| Comp. Example 1 | 2 | 87 |
| Comp. Example 2 | 28 | 63 |
| Comp. Example 3 | 70 | 0 |
| Comp. Example 4 | 20 | 0 |
| Comp. Example 5 | 47 | 0 |

According to the present invention, as described above in detail, there is provided an anisotropically electroconductive resin film having excellent resolving performance as compared with the conventional ones and connection of circuits with high degree of fineness is made possible.

What is claimed is:

1. A process for producing an anisotropically electroconductive resin film on both sides of which electroconductive particles are exposed, said process comprising steps of:
   forming a sticking material layer on a light-transmissible substrate;
   forming on the sticking material layer a layer of spherical electroconductive particles with a thickness of single particle size, with the particles being dispersed uniformly in a plane direction so as not to contact each other and with the particles sticking to the sticking material layer;
   coating a photocurable film-forming resin solution on the layer of the particles to fill spaces between the particles,
   curing portions of the film-forming resin by irradiating a light only from a substrate side,
   dissolving and removing uncured portions of the film-forming resin from surfaces of the electroconductive particles, and
   peeling the cured film-forming resin along an interface between the film-forming resin and the sticking material layer to provide the anisotropically electroconductive resin film which shows electroconductivity only in a film thickness direction.

2. The process according to claim 1, wherein the electroconductive particles are electroconductive particles having elasticity.

3. The process according to claim 2, wherein the electroconductive particles are electroconductive plastic particles, or plastic particles having a metal deposit on the surface thereof.

4. The process according to claim 2, wherein the electroconductive particles are spherical plastic particles having a metal deposit on the surface thereof.

5. The process according to claim 2, wherein the electroconductive particles are covered with an electrically insulating layer.

6. The process according to claim 5, wherein the insulating layer comprises a resin incompatible with the film-forming resin, and removable with heating under pressure or being able to be dissolved away using a solvent.

7. The process according to claim 1, wherein the step of forming the layer of spherical electroconductive particles is conducted after placing a mask comprising a film or a net having pores therein on the sticking material layer, and thereafter depositing the spherical electroconductive particles on the mask to stick the electroconductive particles on the sticking material layer through the pores of the mask; said process further comprising a step of removing the mask after formation of the cured film-forming resin.

8. A process for producing an anisotropically electroconductive resin film on both sides of which electroconductive particles are exposed, said process comprising steps of:
   forming a sticking material layer on a substrate,
   forming on the sticking material layer a layer of spherical electroconductive particles with a thickness of single particle size, with the particles being dispersed uniformly in a plane direction so that the particles do not contact each other and with the particles sticking on the sticking material layer,
   coating a film-forming resin solution on the particle layer so as to fill spaces between the particles,
   curing portions of the film-forming resin with electron beams irradiated only from a substrate side,
   dissolving and removing uncured portions of the film-forming resin from surfaces of electroconductive particles, and
   peeling the cured film-forming resin along an interface between the film-forming resin and the sticking material layer to provide an anisotropically electroconductive resin film which shows electroconductivity only in a film thickness direction.

9. The process according to claim 8, wherein the electroconductive particles are electroconductive particles having elasticity.

10. The process according to claim 9, wherein the electroconductive particles are electroconductive plastic particles, or plastic particles having a metal deposit on the surface thereof.

11. The process according to claim 9, wherein the electroconductive particles are spherical plastic particles having a metal deposit on the surfaces thereof.

12. The process according to claim 9, wherein the electroconductive particles are covered with an electrically insulating layer particles increase.

13. The process according to claim 12, wherein the insulating layer comprises a resin incompatible with the film-forming resin, and removable with heating under pressure or being able to be dissolved away using a solvent.

14. The process according to claim 8, wherein the step of forming the layer of spherical electroconductive particles is conducted after placing a mask comprising a film or a net having pores therein on the sticking material layer, and thereafter depositing the spherical electroconductive particles on the mask to stick the electroconductive particles on the sticking material layer through the pores of the mask; said process further comprising a step of removing the mask after formation of the cured film-forming resin.

15. A process for producing an anisotropically electroconductive film-forming adhesive layer containing electroconductive particles therein, which comprises steps of:

forming a sticking material layer on a substrate, forming on the sticking material layer a layer of the electroconductive particles having elasticity and having a first thickness of single particle size, with the particles being dispersed uniformly in a plane direction without agglomeration, and with the particles sticking on the sticking material layer, wherein the electroconductive particles are covered with an electrically insulating layer, coating a film-forming adhesive solution on the particle layer to fill spaces between the particles, drying the film-forming adhesive solution to form a film-forming adhesive layer having the electroconductive particles dispersed therein, wherein the insulating layer comprises a resin incompatible with the film forming adhesive layer, and removable with heating under pressure, and separating the film-forming adhesive layer having the electroconductive particles dispersed therein from the sticking material layer and the substrate, said film-forming adhesive layer having a second thickness larger than said first thickness of said electroconductive particles and obtains a connected structure of circuits of opposed electrical conductors having no void and substantially no squeeze-out of adhesive from said film-forming adhesive layer when said opposed electrical conductors are pressed together.

* * * * *